US012660360B2

(12) United States Patent
Chen

(10) Patent No.: US 12,660,360 B2
(45) Date of Patent: Jun. 16, 2026

(54) OPTICAL DEVICE

(71) Applicant: Advanced Semiconductor Engineering, Inc., Kaohsiung (TW)

(72) Inventor: Ying-Chung Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 632 days.

(21) Appl. No.: 18/092,142

(22) Filed: Dec. 30, 2022

(65) Prior Publication Data

US 2024/0222543 A1    Jul. 4, 2024

(51) Int. Cl.
| | |
|---|---|
| *H10F 55/255* | (2025.01) |
| *H10F 71/00* | (2025.01) |
| *H10F 77/30* | (2025.01) |
| *H10F 77/50* | (2025.01) |
| *G01S 7/481* | (2006.01) |

(52) U.S. Cl.
CPC ........... *H10F 55/255* (2025.01); *H10F 71/00* (2025.01); *H10F 77/334* (2025.01); *H10F 77/337* (2025.01); *H10F 77/50* (2025.01); *G01S 7/4813* (2013.01)

(58) Field of Classification Search
CPC ........ H10F 55/255; H10F 55/25; H10F 71/00;
H10F 77/334; H10F 77/337; H10F 77/50;
G01S 7/4813; G01S 7/4865; G01S 17/04;
G01S 17/894; H01L 23/16; H01L
23/3107; H01L 25/167
See application file for complete search history.

(56) References Cited

U.S. PATENT DOCUMENTS

| | | | |
|---|---|---|---|
| 2013/0292705 A1* | 11/2013 | Makimura | H01H 57/00 |
| | | | 257/81 |
| 2015/0187963 A1 | 7/2015 | Tu et al. | |
| 2016/0240721 A1* | 8/2016 | Chu | G01J 1/0407 |
| 2017/0141241 A1* | 5/2017 | Yu | G01J 1/0214 |
| 2021/0135069 A1* | 5/2021 | Coffy | H01L 25/167 |
| 2022/0099571 A1* | 3/2022 | Goh | G02B 6/4245 |
| 2024/0222543 A1 | 7/2024 | Chen | |

FOREIGN PATENT DOCUMENTS

| | | | |
|---|---|---|---|
| CN | 104752416 A1 | 7/2015 | |
| CN | 112259634 A * | 1/2021 | ........... H10H 20/852 |

* cited by examiner

*Primary Examiner* — Sitaramarao S Yechuri
(74) *Attorney, Agent, or Firm* — Foley and Lardner LLP

(57) ABSTRACT

An optical device includes an emitter, a receiver, a transparent element, and a block layer. The transparent element is disposed over the emitter and the receiver. The transparent element defines a recess between the emitter and the receiver. The block layer is conformally disposed over the transparent element and the recess.

16 Claims, 33 Drawing Sheets

OPTICAL DEVICE

BACKGROUND

1. Field of the Disclosure

The present disclosure relates to an optical device, and in particular to an optical device including a block layer.

2. Description of Related Art

As technology involving semiconductor assemblies (such as an optical device) improves, the size of the semiconductor assemblies becomes much smaller. Generally, an optical package including one or more Time of Flight (ToF) sensors may utilize a plastic lid to define the profile of the optical device and define the apertures to ensure that an optical signal can be detected. However, said plastic lid is formed by an injection molding technique which needs a relatively large predetermined distance between components within the plastic lid for process tolerance, and adversely affects the miniaturization of an optical device. Therefore, it is desirable to reduce the size of the optical device in order to cater to applications requiring a sufficiently thin optical device.

SUMMARY

According to some embodiments of the present disclosure, an optical device includes an emitter, a receiver, a transparent element, and a block layer. The transparent element is disposed over the emitter and the receiver. The transparent element defines a recess between the emitter and the receiver. The block layer is conformally disposed over the transparent element and the recess.

According to some embodiments of the present disclosure, an optical device includes a carrier, an electronic component, and a block layer. The electronic component is disposed over the carrier. The block layer defines a space accommodating the electronic component. The block layer includes a first portion protruded from an upper surface of the block layer and toward a direction far away from the carrier, and the first portion of the block layer defines an aperture exposing the electronic component.

According to some embodiments of the present disclosure, an optical device includes a carrier, a first electronic component, a second electronic component, and a block layer. The first electronic component is disposed over the carrier. The second electronic component is disposed over the carrier. The block layer separates the first electronic component from the second electronic component. The block layer defines a recess between the first electronic component and the second electronic component.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1A:
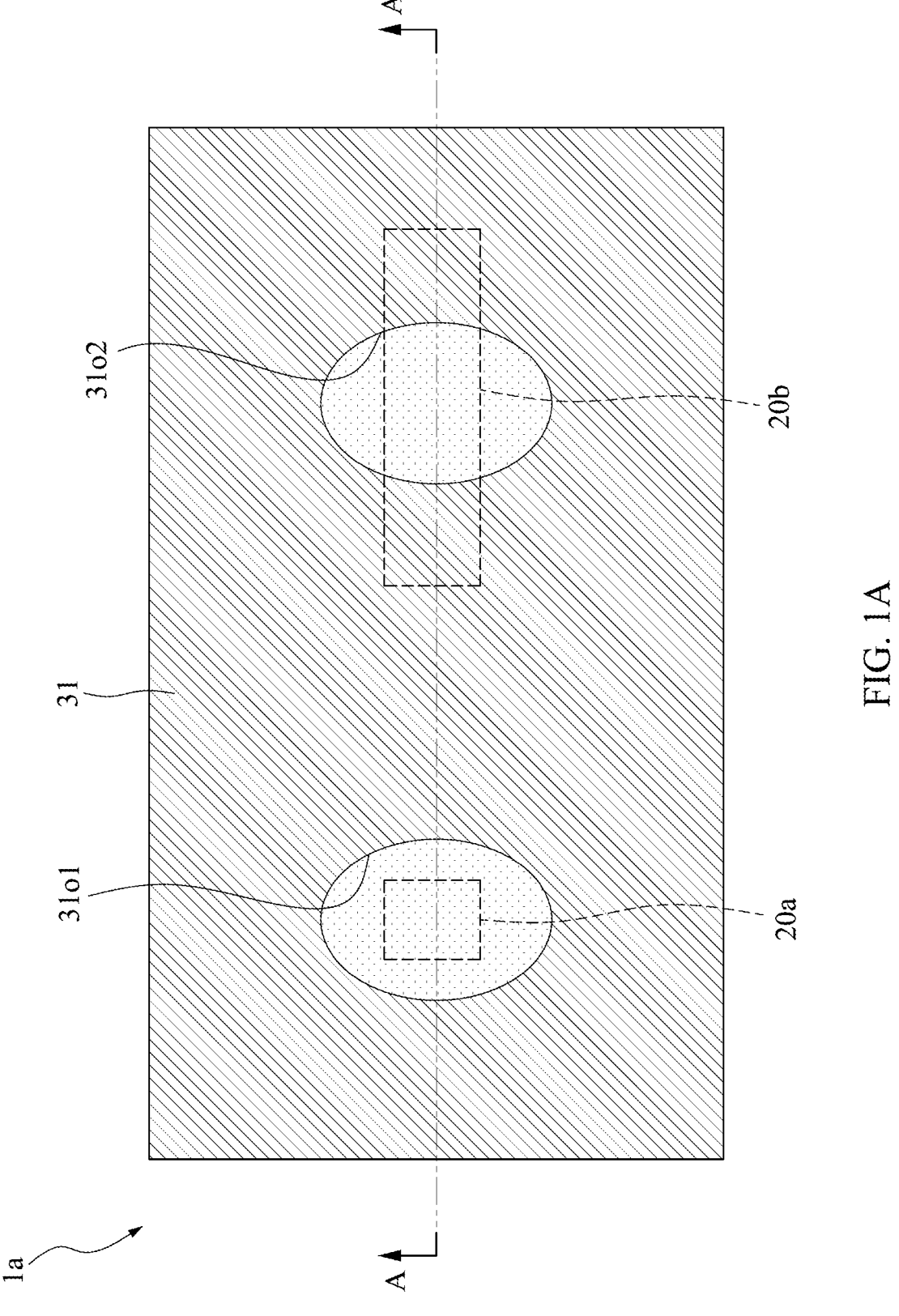
FIG. 1A is a top view of an optical device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1B:
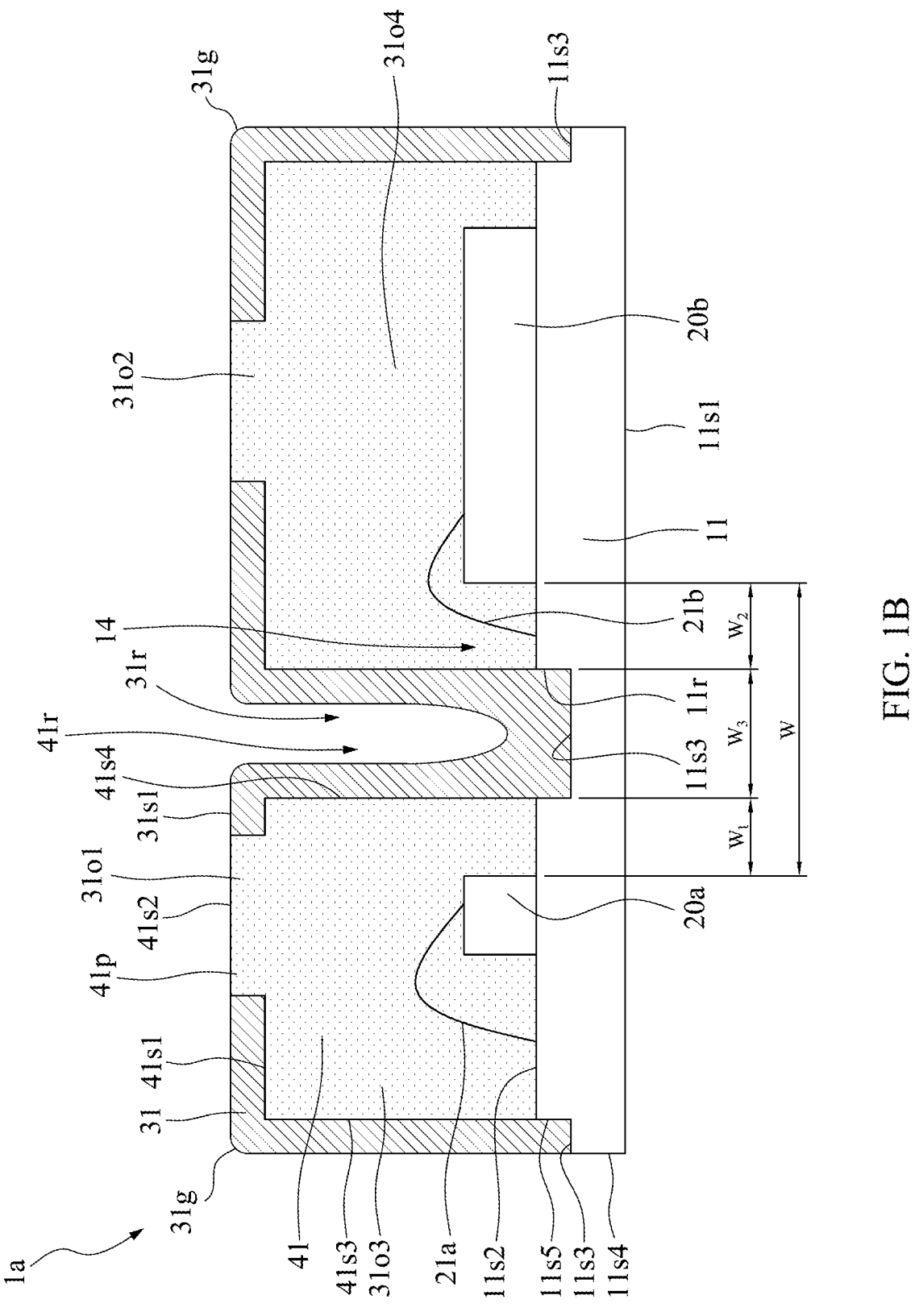
FIG. 1B is a cross-sectional view along line A-A' of the optical device as shown in FIG. 1A in accordance with some embodiments of the present disclosure.

FIG. 1A and FIG. 1B illustrate an optical device 1*a* in accordance with some embodiments of the present disclosure, wherein FIG. 1A is a top view, and FIG. 1B is a cross-sectional view along line A-A' of FIG. 1A. In some embodiments, the optical device 1*a* may include a carrier 11, electronic components 20*a* and 20*b*, a block layer 31, as well as a transparent element 41.

As shown in FIG. 1A, the block layer 31 may define an aperture 31*o*1 and an aperture 31*o*2. The aperture 31*o*1 of the block layer 31 may be configured to expose the electronic component 20*a*. The aperture 31*o*2 of the block layer 31 may be configured to expose the electronic component 20*b*. The aperture 31*o*1 and/or 31*o*2 of the block layer 31 may include a circular profile, an elliptical profile, or other suitable profiles.

As shown in FIG. 1B, the carrier 11 may be configured to support the electronic components 20*a* and 20*b*, the block layer 31, and/or the transparent element 41. The carrier 11 may be formed of, for example, a printed circuit board, such as a paper-based copper foil laminate, a composite copper foil laminate, or a polymer-impregnated glass-fiber-based copper foil laminate. The carrier 11 may include a redistribution structure (not shown) therein. The redistribution structure may include multiple dielectric layers, metal layers and vias.

The carrier 11 may have a surface 11*s*1 (or a bottom surface) and a surface 11*s*2 (or a top surface) opposite to the surface 11*s*1. In some embodiments, the carrier 11 may have a surface 11*s*3 (or a top surface) recessed from the surface 11*s*2. The elevation or level of the surface 11*s*3 may be lower than that of the surface 11*s*2. The carrier 11 may have a surface 11*s*4 (or a lateral surface) extending between the surfaces 11*s*1 and 11*s*3. In some embodiments, the carrier 11 may have a surface 11*s*5 (or a lateral surface) extending between the surfaces 11*s*2 and 11*s*3. The surface 11*s*3 may extend between the surface 11*s*4 and 11*s*5. In some embodiments, the carrier 11 may define a recess 11*r* between the electronic components 20*a* and 20*b*. The recess 11*r* may be recessed form the surface 11*s*2. The surface 11*s*3 may serve as a bottom of the recess 11*r*.

The electronic component 20*a* may be disposed over or disposed on the surface 11*s*2 of the carrier 11. In some embodiments, the electronic component 20*a* may include an emitter, which is configured to emit an optical signal (e.g., light). In some embodiments, the electronic component 20*a* includes a light-emitting device (LED), a laser diode, or other suitable light-emitting components. In some embodiments, the electronic component 20*a* may have a semiconductor substrate (not shown) and a light-emitting region (not shown) on, adjacent to, or exposed from the semiconductor substrate. The semiconductor substrate may include a silicon substrate or other suitable substrate(s). Some active elements and passive elements (not shown) are formed on or in the semiconductor substrate. The light-emitting region may include, but is not limited to, a blue pixel, a green pixel, a red pixel, an infrared (IR) pixel, and/or an ultraviolet (UV) pixel, which can emit light of different wavelengths.

The electronic component 20*b* may be disposed over or disposed on the surface 11*s*2 of the carrier 11. In some embodiments, the electronic component 20*b* may include a receiver, which is configured to receive an optical signal (e.g., light) emitted from, for example, the electronic component 20*a*. In some embodiments, the electronic component 20*b* may include, but is not limited to, a photo detector and/or other elements that can convert optical signals to electrical signals. The electronic component 20*b* may have a semiconductor substrate (not shown) and a light-receiving region (not shown) on, adjacent to, or exposed from the semiconductor substrate. The semiconductor substrate may include a silicon substrate or other suitable substrate(s). Some active elements and passive elements (not shown) are formed on or in the semiconductor substrate. The light-receiving region may include a photodiode or other suitable element(s).

The optical device 1a may further include a bonding wire 21a. In some embodiments, the bonding wire 21a may be configured to electrically connect the electronic component 20a and the surface 11s2 of the carrier 11. The bonding wire 21a may include, for example, conductive materials, such as copper (Cu), aluminum (Al), iron (Fe), zinc (Zn), nickel (Ni), tin (Sn), lead (Pb), silver (Ag), mercury (Hg), gold (Au) or a combination thereof.

The optical device 1a may further include a bonding wire 21b. The bonding wire 21b may be configured to electrically connect the electronic component 20b and the surface 11s2 of the carrier 11. The material of the bonding wire 21b may be the same as or similar to that of the bonding wire 21a.

In some embodiments, the block layer 31 may be disposed over the surface 11s3 of the carrier 11. In some embodiments, the block layer 31 may be conformally disposed over the transparent element 41. The block layer 31 may be configured to prevent the laterally optical communication between the electronic components 20a and 20b. In some embodiments, the block layer 31 may be configured to separate the electronic component 20a from the electronic component 20b. In some embodiments, the block layer 31 may include an opaque material, such as a black adhesive material or other suitable materials. In some embodiments, the block layer 31 may have a transmittance less than or equal to 3%, such as 3%, 1%, 0.5%, 0.1%, or less, to a peak wavelength of the optical signal (e.g., light) emitted by the electronic component 20a and/or 20b. In some embodiments, the block layer 31 may be configured to prevent the electronic components 20a and/or 20b from being electromagnetically interfered.

In some embodiments, the block layer 31 may further define an aperture 31o3 (or a space) for accommodating the electronic component 20a. The aperture 31o3 may be connected to and communicated with the aperture 31o1. The dimension (e.g., width or diameter) of the aperture 31o3 may be greater than the aperture 31o1. In some embodiments, the block layer 31 may further define an aperture 31o4 (or a space) for accommodating the electronic component 20b. The aperture 31o4 may be connected to and communicated with the aperture 31o2. The dimension (e.g., width or diameter) of the aperture 31o4 may be greater than the aperture 31o2.

The block layer 31 may have a surface 31s1 (or a top surface). In some embodiments, the block layer 31 may define a recess 31r between the electronic components 20a and 20b. The recess 31r may be recessed from the surface 31s1 of the block layer 31. The recess 31r may be defined by an external surface (not annotated) of the block layer 31, which is curved and concave toward the carrier 11. In some embodiments, the block layer 31 may be in contact with the surface 11s3 of the carrier 11. In some embodiments, the block layer 31 may be in contact with the surface 11s5 of the carrier 11. In some embodiments, the block layer 31 may fill in the recess 11r of the carrier 11.

In some embodiments, the transparent element 41 may be disposed over or disposed on the surface 11s2 of the carrier 11. The transparent element 41 may encapsulate the electronic component 20a. The transparent element 41 may encapsulate the electronic component 20b. The transparent element 41 may be transparent to a peak wavelength of an optical signal (e.g., light) emitted by the electronic component 20a and/or 20b. In some embodiments, the transparent element 41 may have a transmittance exceeding or equal to 90%, such as 90%, 95%, 99%, 99.9%, or more, to a peak wavelength of the light emitted by the electronic component 20a and/or 20b.

The transparent element 41 may have a surface 41s1 (or a top surface) and a surface 41s2 (or a top surface). The surface 41s2 may have an elevation or level higher than that of the surface 41s1. The block layer 31 may cover the surface 41s1 of the transparent element 41. The surface 41s2 of the transparent element 41 may be exposed from the block layer 31. The surface 41s2 of the transparent element 41 may be aligned with the surface 31s1 of the block layer 31. The transparent element 41 may include a protruded portion 41p (or a portion or a second portion) defined by the surfaces 41s1 and 41s2 of the transparent element 41. In some embodiments, the protruded portion 41p may be protruded far away from the carrier 11. In some embodiments, the protruded portion 41p of the transparent element 41 may be disposed within the aperture 31o1 and/or 31o2 of the block layer 31. The protruded portion 41p of the transparent element 41 may be defined by the inner wall of the aperture 31o1 and/or 31o2 of the block layer 31 In some embodiments, the protruded portion 41p may vertically overlap the electronic component 20a (or 20b). The protruded portion 41p and the transparent element 41 may be formed concurrently and integrally. Thus, there may be no interface between the protruded portion 41p and the transparent element 41.

The transparent element 41 may have a surface 41s3 (or a lateral surface) and a surface 41s4 (or a lateral surface) opposite to the surface 41s3. The surface 41s3 of the transparent element 41 may face far away from the electronic component 20a and/or 20b. In some embodiments, the surface 41s3 of the transparent element 41 may be substantially aligned with the surface 11s5 of the carrier 11. In some embodiments, the surface 41s4 of the transparent element 41 may be located between the electronic components 20a and 20b. In some embodiments, the surface 41s3 may be substantially parallel to the surface 41s4.

In some embodiments, the block layer 31 may have a bevel 31g (e.g., bevel edge or bevel face) at a corner of the transparent element 41. In some embodiments, the bevel 31g of the block layer 31 may be located at a corner defined by the surfaces 41s1 and 41s3 of the transparent element 41. In some embodiments, the bevel 31g of the block layer 31 may be located at a corner defined by the surfaces 41s1 and 41s4 of the transparent element 41. When the block layer 31 is formed by a coating technique, the block layer 31 is conformally formed on the transparent element 41, and the block layer 31 may have a rounding corner, such as bevel, at a position corresponding to the corner of the transparent element 41.

In some embodiments, the transparent element 41 may define a recess 41r between the electronic components 20a and 20b. In some embodiments, a portion of the block layer 31 may be conformally disposed within the recess 41r of the transparent element 41 and thus define the recess 31r. In some embodiments, the carrier 11 and the transparent element 41 may collectively define a recess (e.g., the recess 11r and/or recess 41r) between the electronic components 20a and 20b. As shown in FIG. 1B, a width W of a gap 14 between the electronic component 20a and the electronic component 20 is substantially equal to a sum of a width of a portion of the transparent element 41 disposed in the gap 14 and a width W3 of a portion of the block layer 13 disposed in the gap 14. The width of the portion of the transparent element 41 disposed in the gap 14 may include a width $W_1$ of a portion of the transparent element 41 disposed between the electronic component 20a and the surface 41s4 and a width W2 of a portion of the transparent element 41 disposed between the electronic component 20b and the surface 41s4. There may be no gap or space between the transparent element 41 and the block layer 13.

In a comparative optical device, a block layer is formed by an injection molding technique, which needs a relatively large predetermined distance between the transparent element and the block layer for process tolerance. Such predetermined distance adversely affects the miniaturization of an optical device. In this embodiment illustrated in FIG. 1A and FIG. 1, the block layer 31 may be formed over the transparent element 41 by a coating technique (e.g., spray coating), and the profile of the transparent element 41 may be determined by a mould configured to form the transparent element 41. Further, the dimension of the aperture 31o1 (or aperture 3102) of the block layer 31 may be defined by the dimension of the protruded portion 41p of the transparent element 41, which may be easily controlled or modified by the mould. In this embodiment, the block layer 31 may be formed on the transparent element 41 directly, thus, a predetermined distance between the block layer 31 and the transparent element 41 is not required, and the width W of the gap 14 may be reduced, which thereby facilitates the miniaturization of the optical device 1a.

Figure 2A:
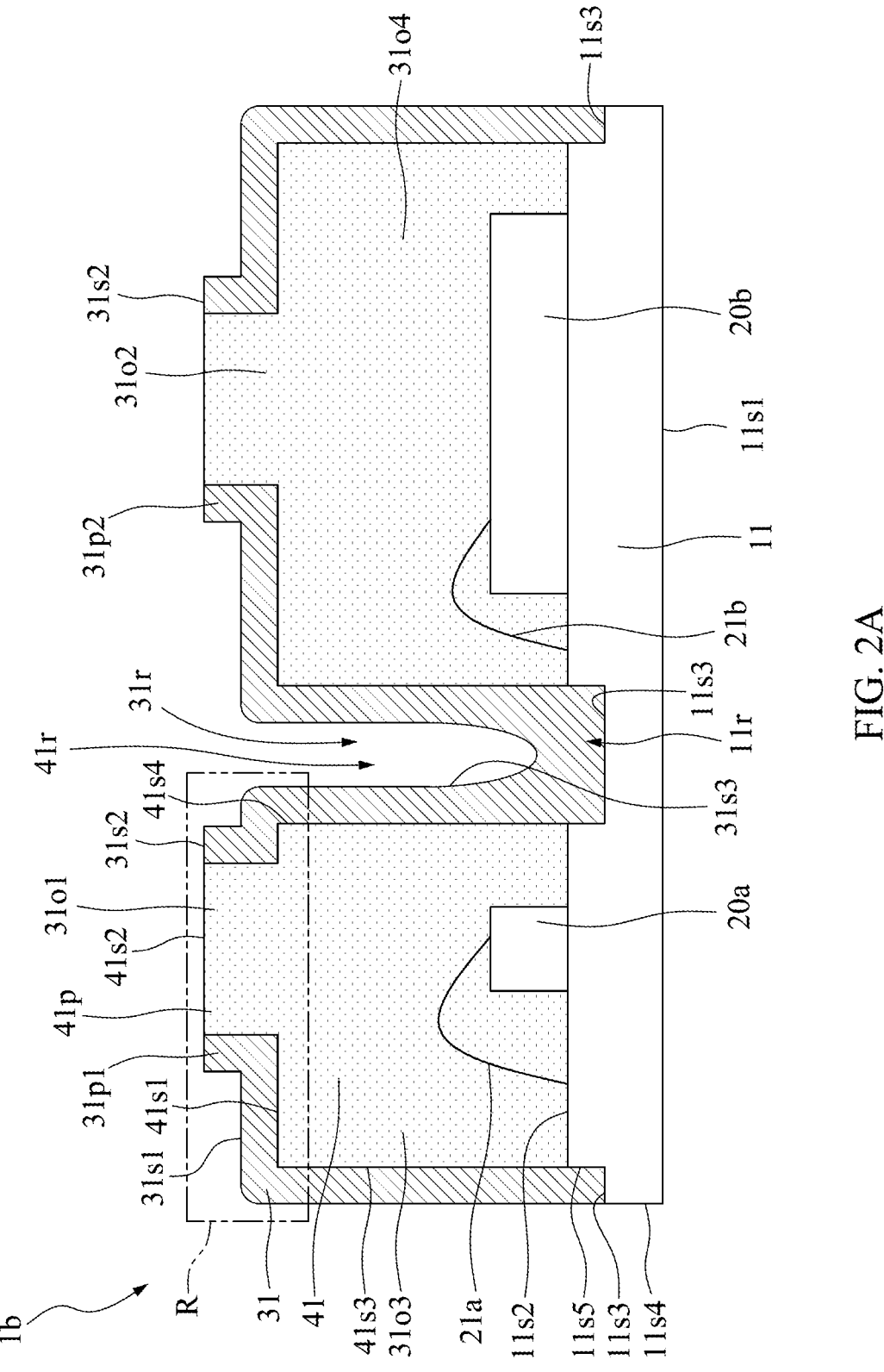
FIG. 2A is a cross-sectional view of an optical device in accordance with some embodiments of the present disclosure.

FIG. 2A is a cross-sectional view of an optical device 1b in accordance with some embodiments of the present disclosure. As shown in FIG. 2A, the optical device 1b may have a structure similar to the optical device 1a of FIG. 1B, except that the block layer 31 of the optical device 1b may define an extended portion 31p1 (or a portion or a first portion) and an extended portion 31p2.

In some embodiments, the block layer 31 may have a surface 31s2 (or a top surface), which has an elevation or level higher than the surface 31s1. In some embodiments, the extended portion 31p1 of the block layer 31 may protrude from the surface 31s1 (e.g. upper surface) of the block layer 31 and toward a direction far away from the carrier 11. The extended portion 31p1 may extend longitudinally. The surface 31s2 may serve as the top surface of the extended portion 31p1. The extended portion 31p1 may define the aperture 31o1 of the block layer 31. In some embodiments, the extended portion 31p1 of the block layer 31 may surround the protruded portion 41p of the transparent element 41. In some embodiments, the extended portion 31p2 of the block layer 31 may protrude from the surface 31s1 of the block layer 31. The extended portion 31p2 may define the aperture 31o2 of the block layer 31. The block layer 31 may have a surface 31s3 (or a lateral surface), which serves as the sidewall of the recess 31r. In some embodiments, the surface 31s3 of the block layer 31 may be curved. In some embodiments, the surface 31s3 of the block layer 31 may include a stepped structure or stepped portion.

In some embodiments, the transparent element 41 may have a surface 41s2 (or a top surface), which has an elevation or level higher than the surface 41s1. In some embodiments, the surface 41s2 of the transparent element 41 may be substantially aligned with the surface 31s2 of the block layer 31. In some embodiments, the surface 41s2 of the protruded portion 41p may be substantially level with the surface 31s2 of the extended portion 31p1. In some embodiments, the surface 41s2 of the transparent element 41 may be exposed from the block layer 31. In some embodiments, the block layer 31 and the transparent element 41 collectively define the aperture 31o1 (or 3102).

Figure 2B:
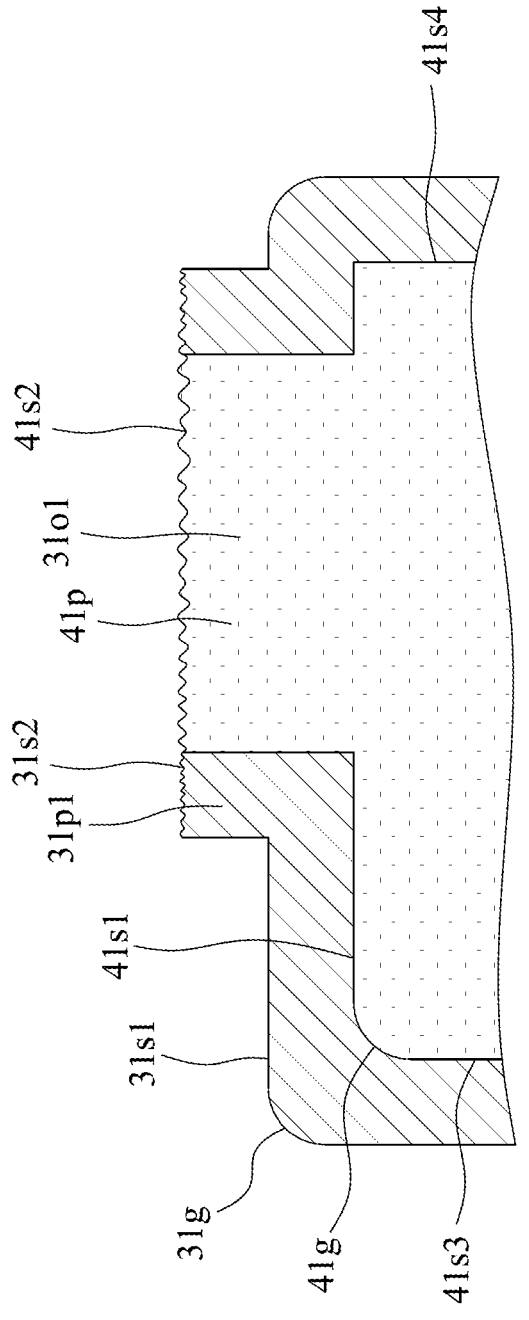
FIG. 2B is an enlarged view of region R of the optical device illustrated in FIG. 2A in accordance with some embodiments of the present disclosure.

Referring to FIG. 2B, it is an enlarged view of region R of the optical device 1b illustrated in FIG. 2A in accordance with some embodiments of the present disclosure. In some embodiments, a surface roughness of the surface 31s2 of the block layer 31 may be greater than a surface roughness of one of other surfaces of the block layer 31. In some embodiments, the surface roughness of the surface 31s1 may be different from that of the surface 31s2 of the block layer 31. In some embodiments, the surface roughness of the surface 31s1 may be less than that of the surface 31s2 of the block layer 31 since the surface 31s2 of the block layer 31 may be formed by grinding. In some embodiments, a surface roughness of the surface 41s2 of the transparent element 41 may be greater than a surface roughness of one of other surfaces of the transparent element 41. In some embodiments, the surface roughness of the surface 41s1 may be different from that of the surface 41s2 of the transparent element 41. In some embodiments, the surface roughness of the surface 41s1 may be less than that of the surface 41s2 of the transparent element 41 since the surface 41s2 of the transparent element 41 may be formed by grinding. In some embodiments, the surface roughness of the surface 31s2 of the block layer 31 may be different from that of the surface 41s2 of the transparent element 41. In other embodiments, the surface roughness of the surface 31s2 of the block layer 31 may be substantially the same as that of the surface 41s2 of the transparent element 41.

In this embodiment, the block layer 31 may be formed over the transparent element 41 by a coating technique, and the dimension of the extended portion 31p1 (or 31p2) may be defined by the dimension of the protruded portion 41p of the transparent element 41, which may be easily controlled or modified by the mould. In this embodiment, a predetermined distance between the block layer 31 and the transparent element 41 is not required, which thereby facilitates the miniaturization of the optical device 1b.

In some embodiments, the transparent element 41 may have a bevel 41g at a corner defined by the surfaces 41s1 and 41s3. In some embodiments, the profile of the transparent element 41 may be defined by a mould, and the transparent element 41 may have a bevel (e.g., 41g) corresponding to a corner of the mould. The transparent element 41 may not have a bevel at a corner defined by the surfaces 41s1 and 41s4. The surface 41s4 of the transparent element 41 may be formed by performing a half-cut technique, which utilizes, for example, a saw to remove a portion of the transparent element 41.

Figure 3:
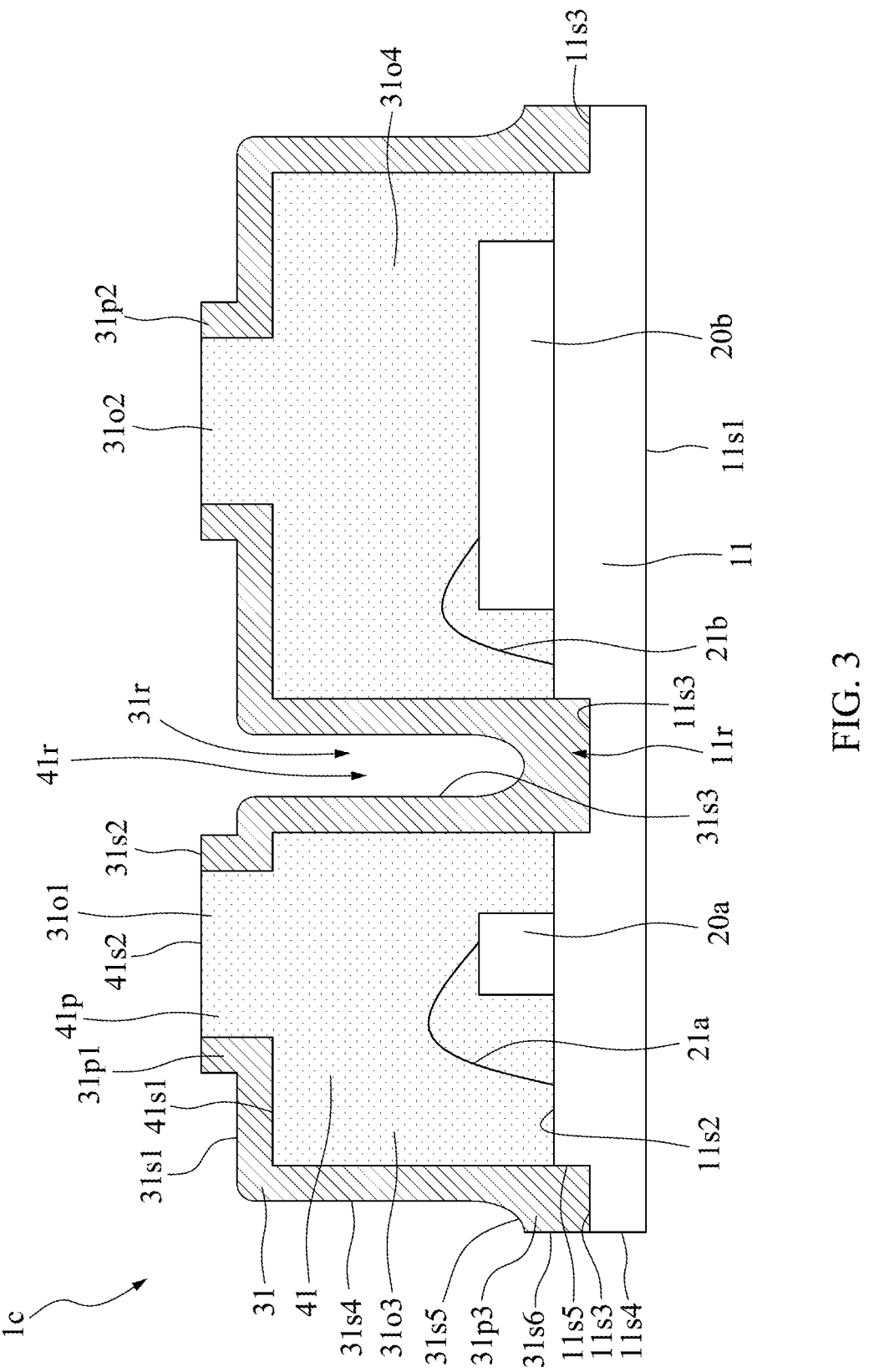
FIG. 3 is a cross-sectional view of an optical device in accordance with some embodiments of the present disclosure.

FIG. 3 is a cross-sectional view of an optical device 1c in accordance with some embodiments of the present disclosure. As shown in FIG. 3, the optical device 1c may have a structure similar to the optical device 1b of FIG. 2A, except that the block layer 31 of the optical device 1c may further include an extended portion 31p3.

The block layer 31 may have a surface 31s4 (or a lateral surface), a surface 31s5 (or a top surface), and a surface 31s6 (or a lateral surface). The surface 31s4 may be opposite to the surface 31s3. The surface 31s4 may extend between the surfaces 31s1 and 31s5. The surface 31s5 may extend between the surfaces 31s4 and 31s6. The surface 31s5 of the block layer 31 may include a curved surface or a curved portion. In some embodiments, the surface 31s6 of the block layer 31 may be substantially aligned with the surface 11s4 of the carrier 11. The surfaces 31s5 and 31s6 of the block layer 31 may define the extended portion 31p3. The extended portion 31p3 of the block layer 31 may extend laterally and outwardly from the electronic component 20a and/or 20b. The extended portion 31p3 of the block layer 31 may protrude from the surface 31s4 of the block layer 31. The surfaces 31s4 and 31s5 of the block layer 31 may collectively define an indentation structure.

Figure 4:
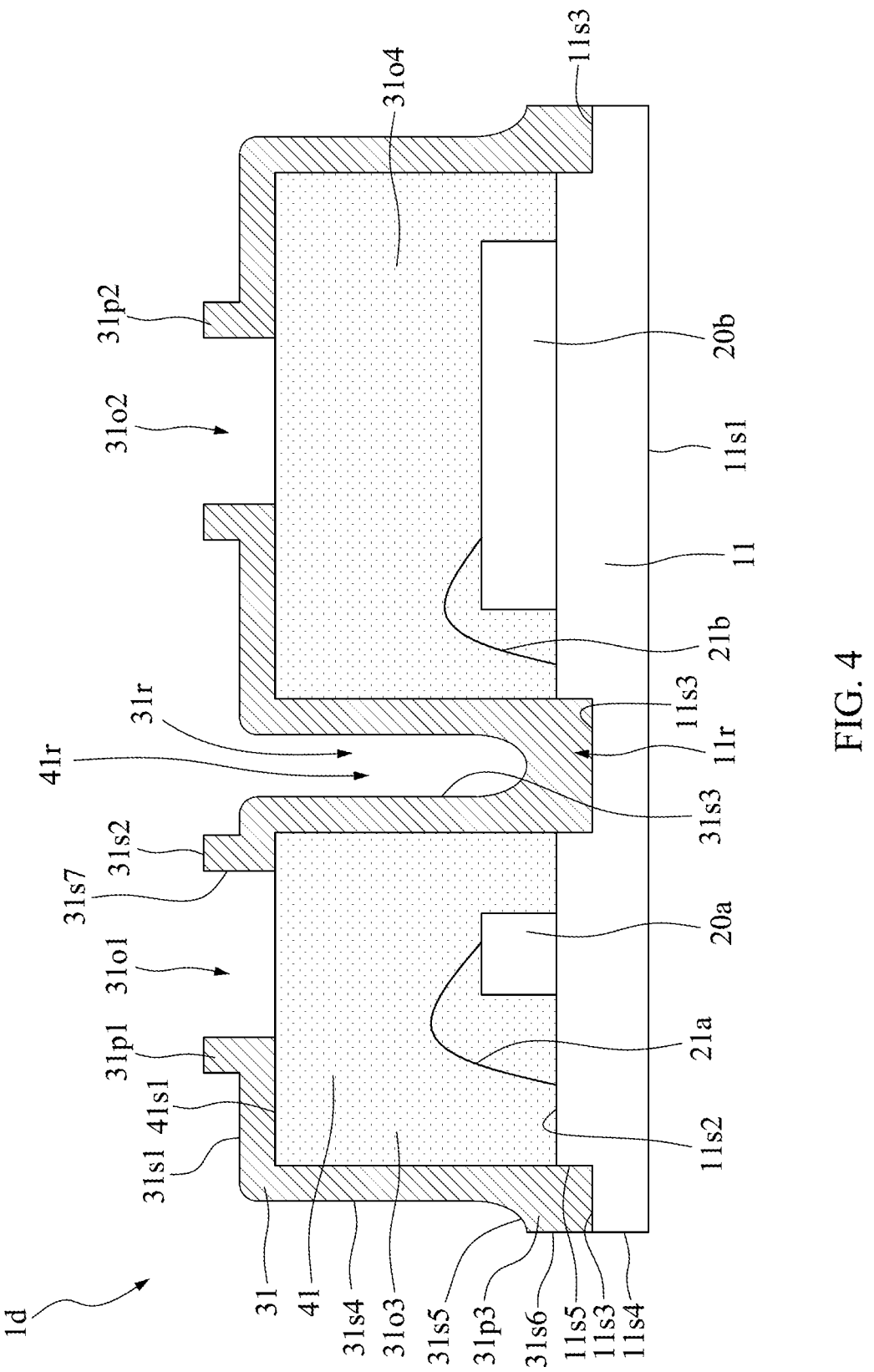
FIG. 4 is a cross-sectional view of an optical device in accordance with some embodiments of the present disclosure.

FIG. 4 is a cross-sectional view of an optical device 1d in accordance with some embodiments of the present disclosure. As shown in FIG. 4, the optical device 1*d* may have a structure similar to the optical device 1*c* of FIG. 3, except that the transparent element 41 of the optical device 1*d* may not fill the aperture 31*o*1 and/or 31*o*2 of the block layer 31.

In some embodiments, the block layer 31 may have a surface 31*s*7 (or an inner sidewall). The surface 31*s*7 may be connected to the surface 31*s*2. The surface 31*s*7 may define the aperture 31*o*1. In some embodiments, the surface 31*s*7 of the block layer 31 may be exposed from the transparent element 41. In some embodiments, a portion of the surface 41*s*1 of the transparent element 41 may be exposed from the block layer 31. In some embodiments, a surface roughness of the surface 41*s*1 of the transparent element 41 may be substantially the same as a surface roughness of one of other surfaces (e.g., the lateral surface) of the transparent element.

Figure 5:
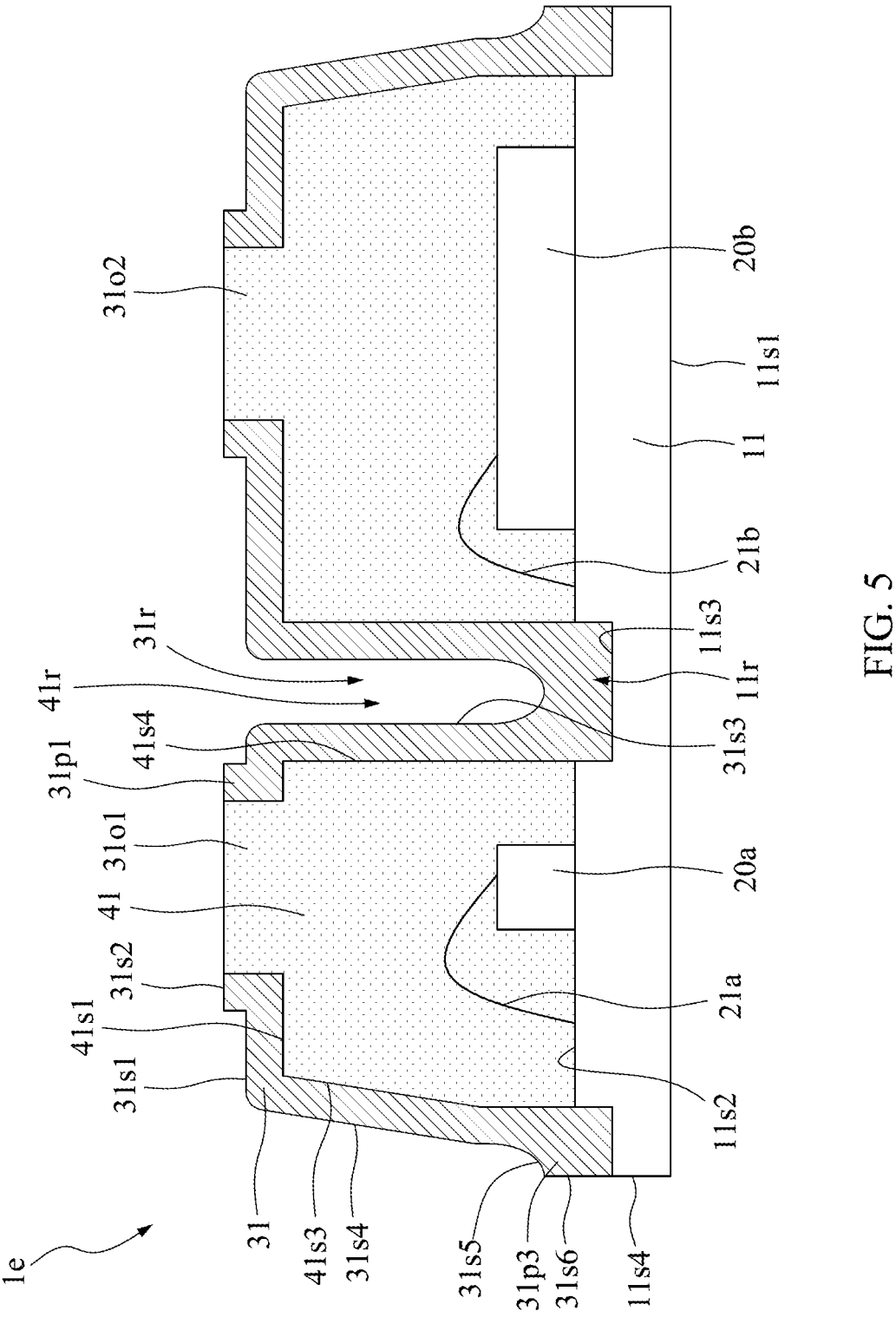
FIG. 5 is a cross-sectional view of an optical device in accordance with some embodiments of the present disclosure.

FIG. 5 is a cross-sectional view of an optical device 1*e* in accordance with some embodiments of the present disclosure. As shown in FIG. 5, the optical device 1*e* may have a structure similar to the optical device 1*c* of FIG. 3, except that the transparent element 41 of the optical device 1*e* may have a slanted lateral surface.

In some embodiments, the surface 41*s*3 of the transparent element 41 may be slanted with respect to the surface 41*s*1 of the transparent element 41. In some embodiments, the surface 41*s*3 may be nonparallel to the surface 41*s*4 of the transparent element 41. In some embodiments, the surface 31*s*4 of the block layer 31 may be slanted with respect to the surface 31*s*1 of the block layer 31. In some embodiments, the surface 31*s*4 of the block layer 31 may be nonparallel to the surface 31*s*3 of the block layer 31.

Figure 6:
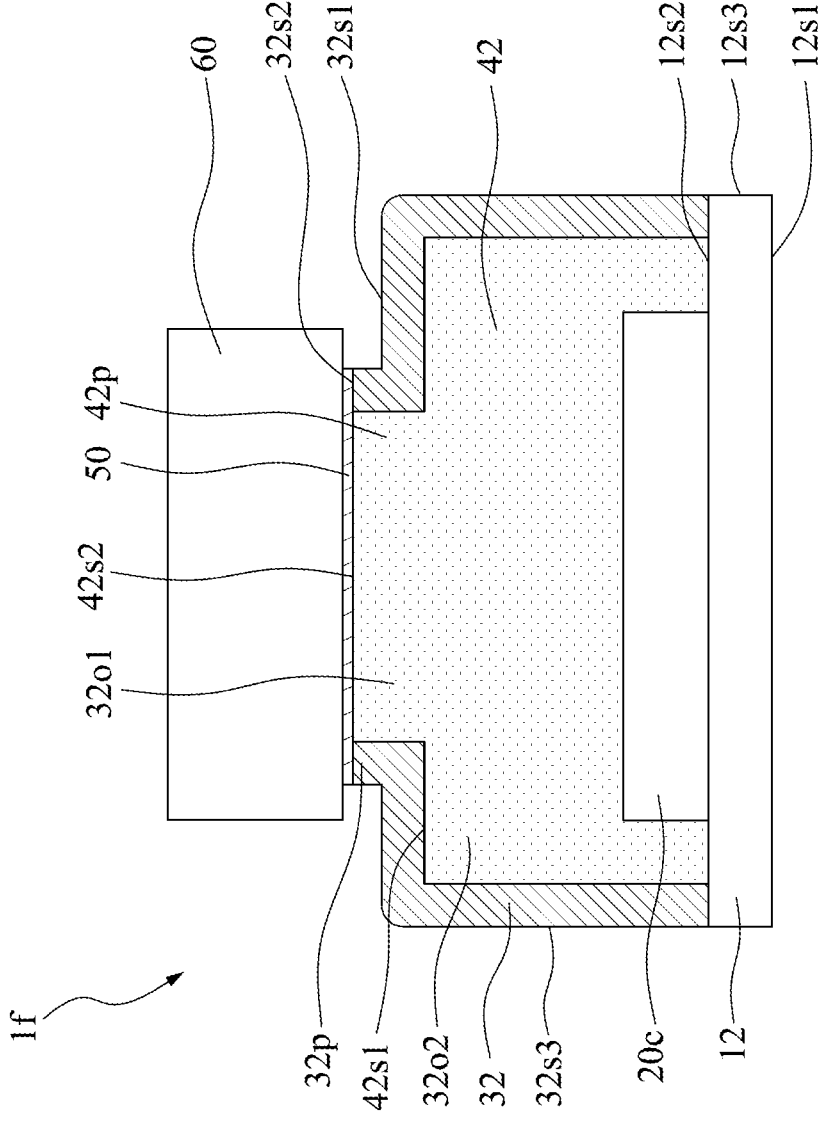
FIG. 6 is a cross-sectional view of an optical device in accordance with some embodiments of the present disclosure.

FIG. 6 is a cross-sectional view of an optical device if in accordance with some embodiments of the present disclosure. In some embodiments, the optical device if may include a carrier 12, an electronic component 20*c*, a block layer 32, a transparent element 42, an adhesive element 50, and an optical element 60.

The carrier 12 may be configured to support the electronic component 20*c*, the block layer 32, and/or the transparent element 42. The carrier 12 may be formed of, for example, a printed circuit board, such as a paper-based copper foil laminate, a composite copper foil laminate, or a polymer-impregnated glass-fiber-based copper foil laminate. The carrier 12 may have a surface 12*s*1 (or a bottom surface), a surface 12*s*2 (or a top surface) opposite to the surface 12*s*1, and a surface 12*s*3 (or a lateral surface) extending between the surfaces 12*s*1 and 12*s*2.

The electronic component 20*c* may be disposed over or disposed on the surface 12*s*2 of the carrier 12. The electronic component 20*c* may be an emitter or a receiver. The electronic component 20*c* may be optically coupled to the optical element 60.

The block layer 32 may be disposed over the surface 12*s*2 of the carrier 12. In some embodiments, the block layer 32 may include an opaque material. In some embodiments, the block layer 32 may define an aperture 32*o*1 exposing the electronic component 20*c*. In some embodiments, the block layer 32 may define an aperture 32*o*2 (or a space) for accommodating the electronic component 20*c*. The aperture 32*o*2 may be connected to or communicated with the aperture 32*o*1. The dimension (e.g., width or diameter) of the aperture 32*o*2 may be greater than that of the aperture 32*o*1.

The block layer 32 may have a surface 32*s*1 (or a top surface) and a surface 32*s*2 (or a top surface). The surface 32*s*2 may have an elevation or a level higher than that of the surface 32*s*1 of the block layer 32. The surfaces 32*s*1 and 32*s*2 of the block layer 32 may define an extended portion 32*p*. The extended portion 32*p* may protrude from the surface 32*s*1 of the block layer 32.

The transparent element 42 may be disposed over the surface 12*s*2 of the carrier 12. The transparent element 42 may encapsulate the electronic component 20*c*. The transparent element 42 may have a surface 42*s*1 (or a top surface) and a surface 42*s*2 (or a top surface). The surface 42*s*2 may have an elevation or a level higher than that of the surface 42*s*1 of the transparent element 42. In some embodiments, the surface 42*s*2 of the transparent element 42 may be substantially aligned with the surface 32*s*2 of the block layer 32. In some embodiments, the transparent element 42 may include a protruded portion 42*p* protruding from the surface 42*s*1 of the transparent element 42. In some embodiments, the protruded portion 42*p* of the transparent element 42 may be disposed within the aperture 32*o*1 of the block layer 32.

In some embodiments, the adhesive element 50 may be disposed over the surface 32*s*2 of the block layer 32. In some embodiments, the adhesive element 50 may be disposed over the extended portion 32*p* of the block layer 32. In some embodiments, the adhesive element 50 may be disposed over the surface 42*s*2 of the transparent element 42. In some embodiments, the adhesive element 50 may be disposed over the protruded portion 42*p* of the transparent element 42. The adhesive element 50 may be configured to attach the optical element 60 to the block layer 32 and/or transparent element 42. In some embodiments, the adhesive element 50 may include an optical clear adhesive (OCA) or other suitable adhesives.

In some embodiments, the optical element 60 may be disposed over the adhesive element 50. In some embodiments, the optical element 60 may be disposed over the surface 32*s*2 of the block layer 32. In some embodiments, the optical element 60 may be disposed over the extended portion 32*p* of the block layer 32. In some embodiments, the optical element 60 may be disposed over the surface 42*s*2 of the transparent element 42. In some embodiments, the optical element 60 may be disposed over the protruded portion 42*p* of the transparent element 42. The optical element 60 may cover the aperture 32*o*1 of the block layer 32. The optical element 60 may be configured to optically couple with the electronic component 20*c*. In some embodiments, the optical element 60 may be configured to modify an optical signal (e.g., light) path emitted by or received from the electronic component 20*c*. For example, the optical element 60 may include a diffuser or other suitable optical elements.

In this embodiment, the block layer 32 may be formed over the transparent element 42 by a coating technique, and the dimension of the extended portion 32*p* may be defined by the dimension of the protruded portion 42*p*, which may be easily controlled or modified by a mould. In this embodiment, a predetermined distance between the block layer 32 and the transparent element 42 is not required, which thereby facilitates the miniaturization of the optical device 1*f*.

Figure 7:
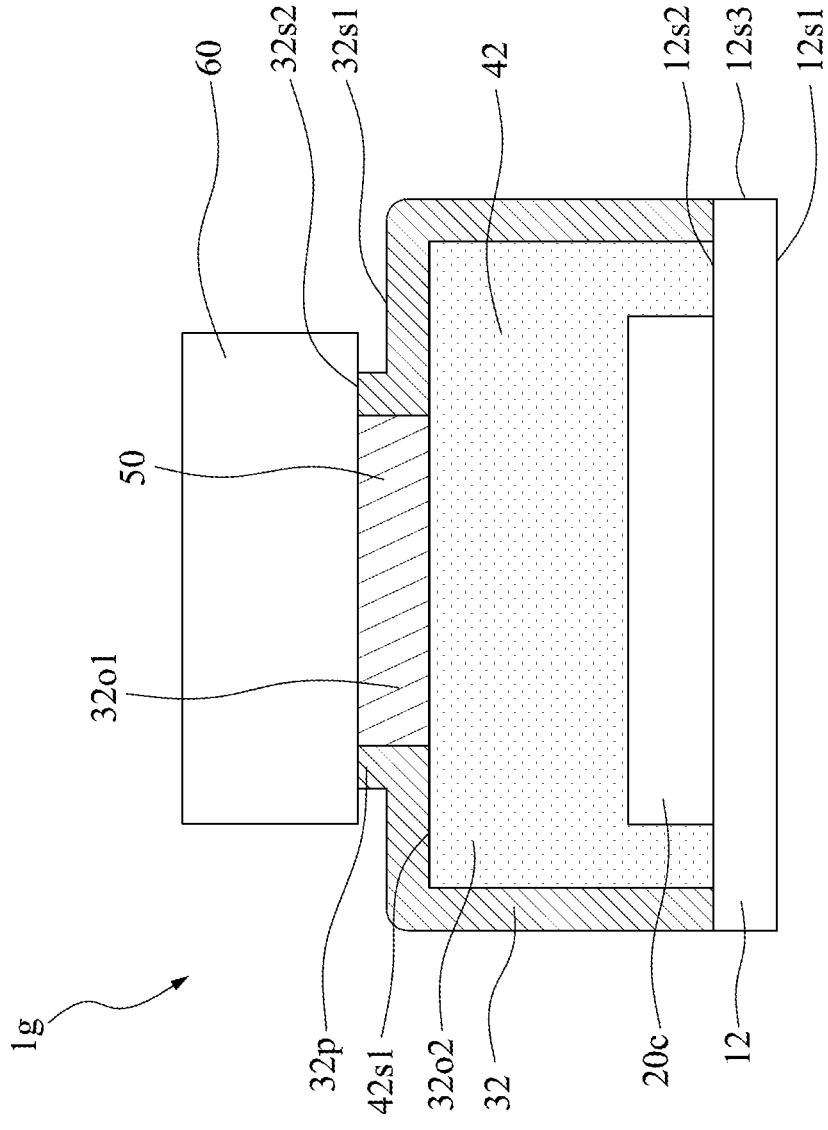
FIG. 7 is a cross-sectional view of an optical device in accordance with some embodiments of the present disclosure.

FIG. 7 is a cross-sectional view of an optical device 1*g* in accordance with some embodiments of the present disclosure. As shown in FIG. 7, the optical device 1*g* may have a structure similar to the optical device if of FIG. 6, except that the protruded portion 42*p* is omitted and the adhesive element 50 of the optical device 1*g* may be disposed within the aperture 32*o*1 of the block layer 32.

In some embodiments, the adhesive element 50 may be disposed over the surface 42*s*1 of the transparent element 42. In some embodiments, the optical element 60 may be in contact with the extended portion 32*p* of the block layer 32.

In some embodiments, the optical element 60 may be in contact with the surface 32s2 of the block layer 32.

Figure 8:
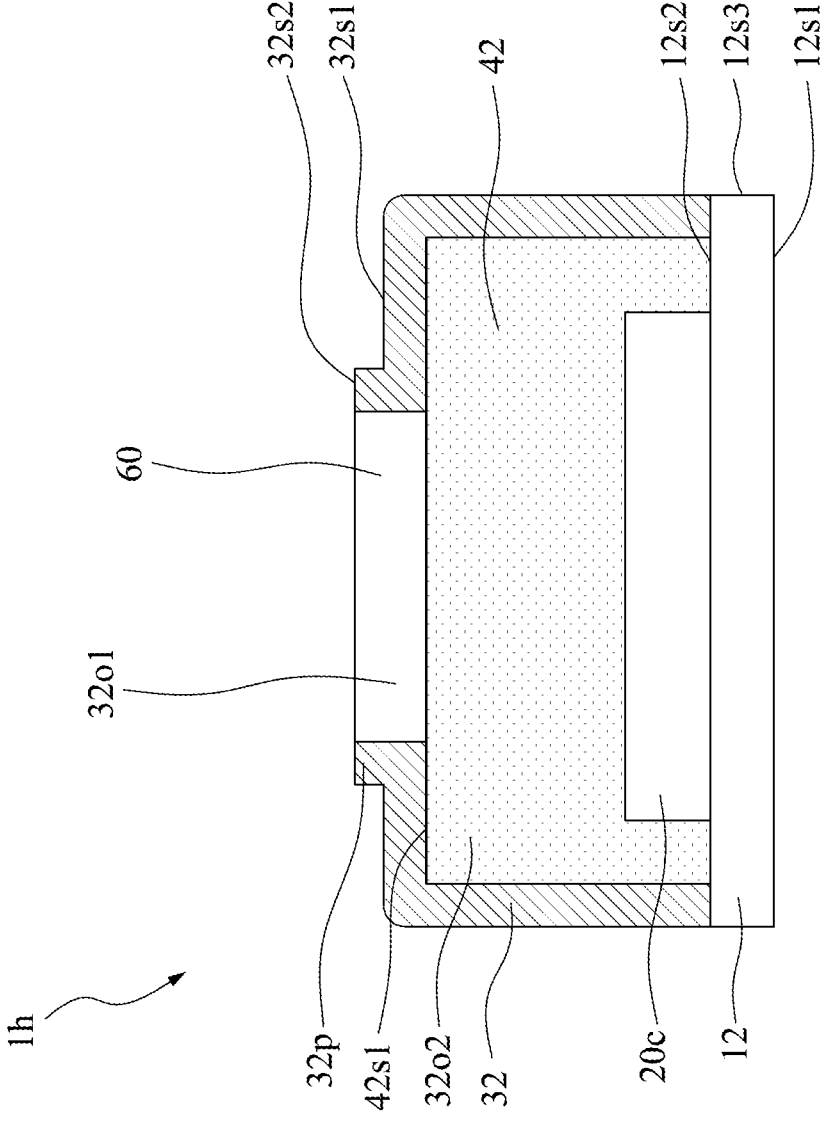
FIG. 8 is a cross-sectional view of an optical device in accordance with some embodiments of the present disclosure.

FIG. 8 is a cross-sectional view of an optical device 1h in accordance with some embodiments of the present disclosure. As shown in FIG. 8, the optical device 1h may have a structure similar to the optical device if of FIG. 6, except that the protruded portion 42p is omitted and the optical element 60 of the optical device 1h may be disposed within the aperture 32o1 of the block layer 32.

In some embodiments, the optical element 60 may be disposed over the surface 42s1 of the transparent element 42. In some embodiments, the top surface (not annotated) of the optical element 60 may be substantially aligned with the surface 32s2 of the block layer 32.

Figure 9A:
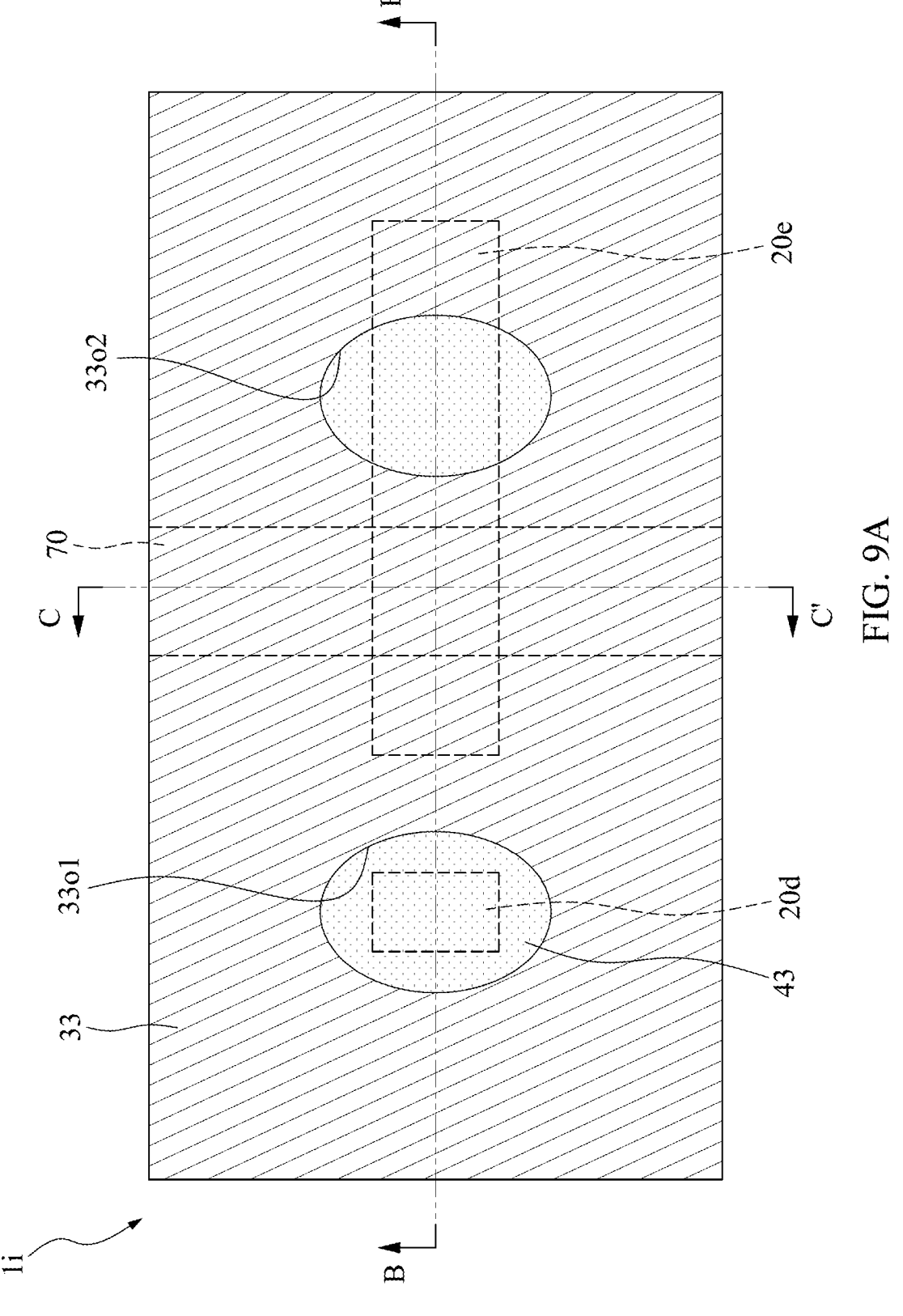
FIG. 9A is a top view of an optical device in accordance with some embodiments of the present disclosure.
Figure 9B:
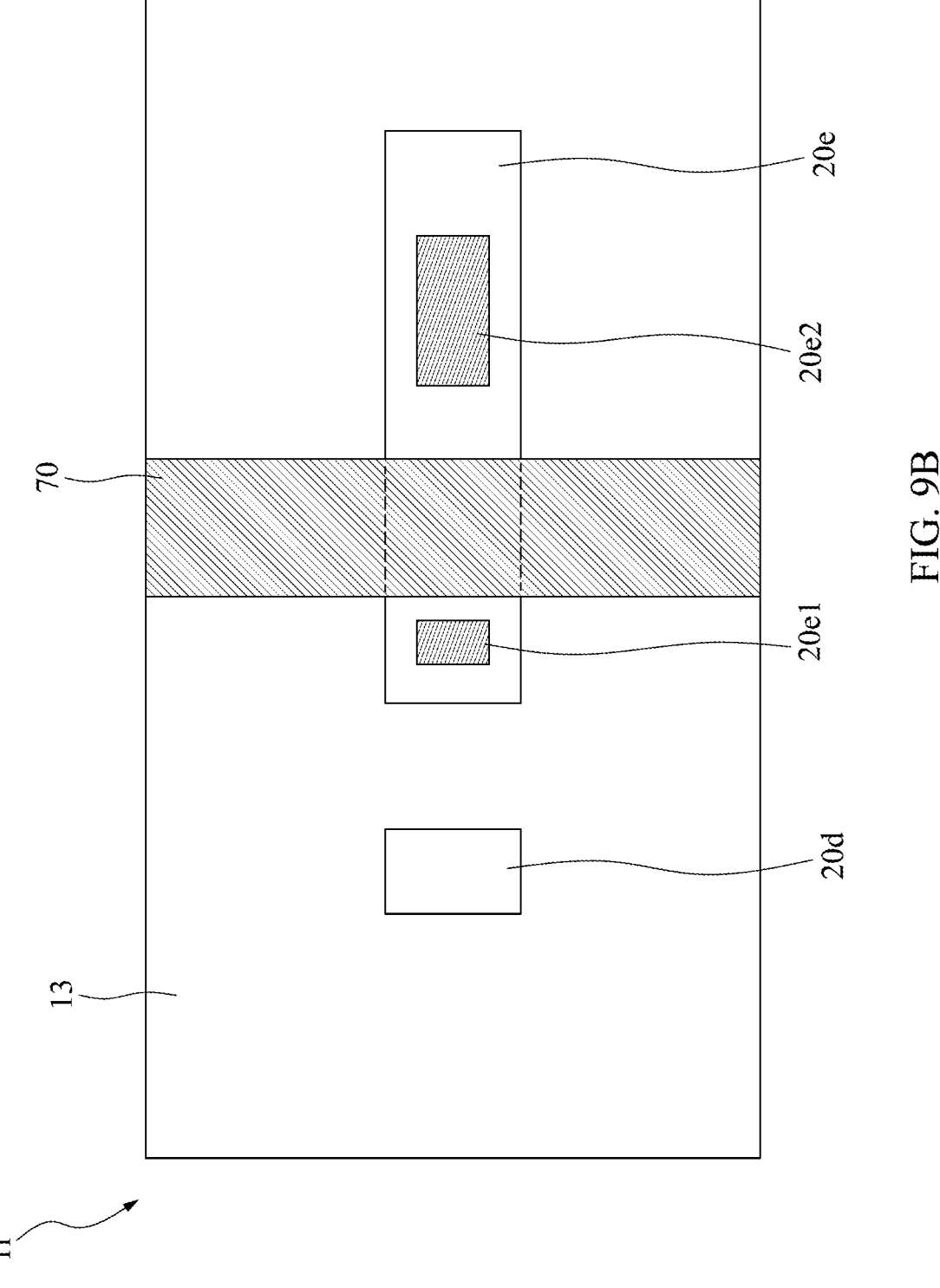
FIG. 9B is a top view of the optical device illustrating electronic components and a dam structure as shown in FIG. 9A.
Figure 9C:
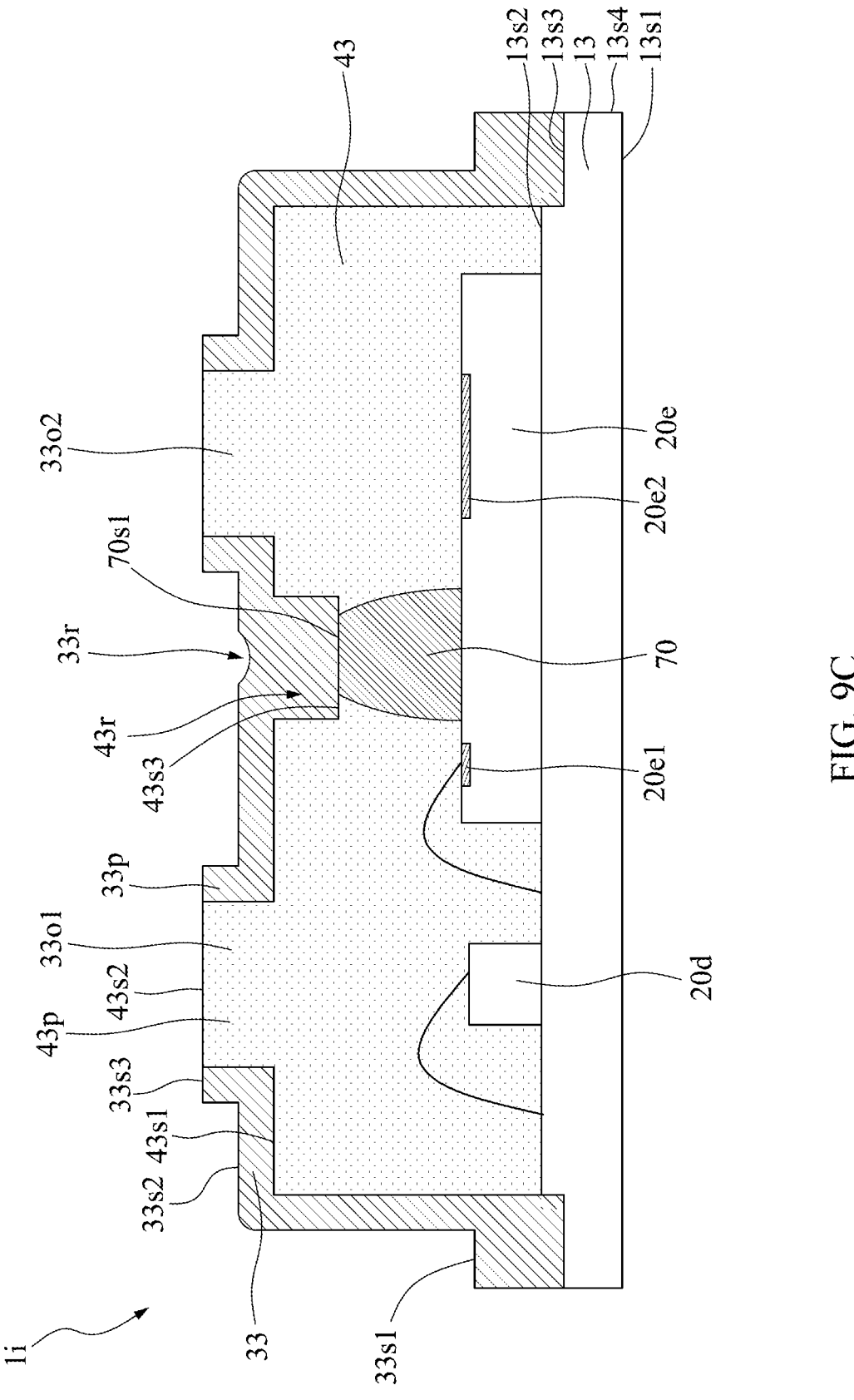
FIG. 9C is a cross-sectional view along line B-B' of the optical device as shown in FIG. 9A in accordance with some embodiments of the present disclosure.
Figure 9D:
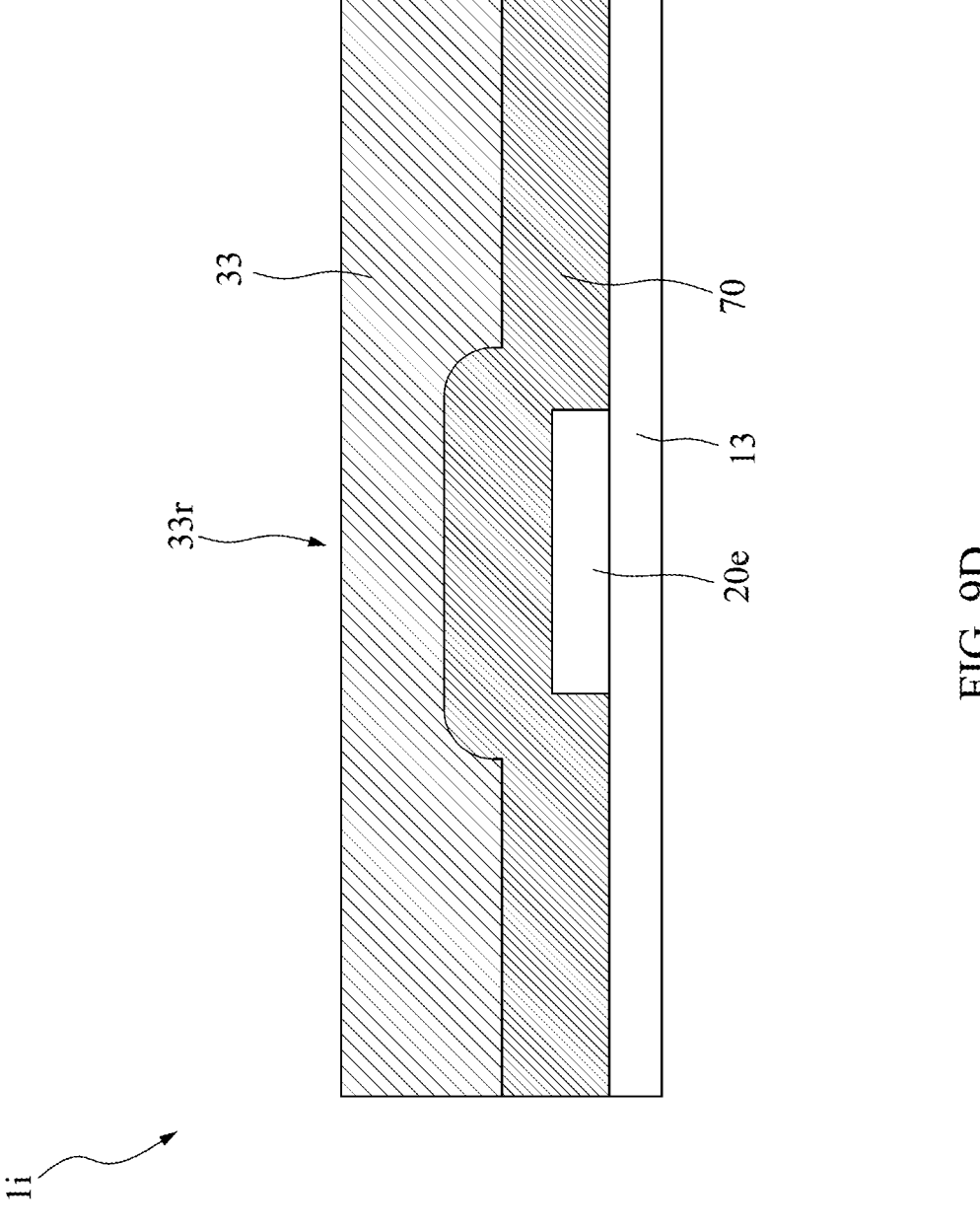
FIG. 9D is a cross-sectional view along line C-C' of the optical device as shown in FIG. 9A in accordance with some embodiments of the present disclosure.

FIG. 9A, FIG. 9B, FIG. 9C, and FIG. 9D illustrate an optical device 1i in accordance with some embodiments of the present disclosure, wherein FIG. 9A and FIG. 9B are a top view perspectives, FIG. 9C is a cross-sectional view along line B-B' of FIG. 9A, and FIG. 9D is a cross-sectional view along line C-C' of FIG. 9A. In some embodiments, the optical device 1i may include a carrier 13, electronic components 20d and 20e, a block layer 33, a transparent element 43, as well as a dam structure 70.

As shown in FIG. 9A, the block layer 33 may define an aperture 33o1 exposing the electronic component 20d. In some embodiments, the block layer 33 may define an aperture 33o2 exposing the electronic component 20e. The aperture 33o1 and/or 33o2 of the block layer 33 may include a circular profile, an elliptical profile, or other suitable profiles.

FIG. 9B only illustrates the carrier 13, the electronic components 20d and 20e, as well as the dam structure 70 for brevity. In some embodiments, the dam structure 70 is disposed across the electronic component 20e. In some embodiments, the dam structure 70 may be disposed between sensing regions 20e1 and 20e2 of the electronic component 20e.

As shown in FIG. 9C, the carrier 13 may be configured to support the electronic components 20d and 20e, the block layer 33, and/or the transparent element 43. The carrier 13 may be formed of, for example, a printed circuit board, such as a paper-based copper foil laminate, a composite copper foil laminate, or a polymer-impregnated glass-fiber-based copper foil laminate. The carrier 13 may have a surface 13s1 (or a bottom surface), and a surface 13s2 (or a top surface) opposite to the surface 13s1. The carrier 13 may have a surface 13s3 (or a top surface) recessed from the surface 13s2. The carrier 13 may have a surface 13s4 (or a lateral surface) extending between the surfaces 13s1 and 13s3.

The electronic component 20d may be disposed over the surface 13s2 of the carrier 13. In some embodiments, the electronic component 20d may include an emitter. The electronic component 20e may be disposed over the surface 13s2 of the carrier 13. In some embodiments, the electronic component 20e may include a receiver, which is configured to receive an optical signal (e.g., light) emitted from, for example, the electronic component 20d. In some embodiments, the electronic component 20e may include a sensing region 20e1 and a sensing region 20e2 different from the sensing region 20e1. The sensing region 20e1 of the electronic component 20e may be configured to receive an optical signal (e.g., light) from the electronic component 20d. The sensing region 20e2 of the electronic component 20e may be configured to receive an optical signal (e.g., light) reflected from a target object (not shown), which may reflect an optical signal (e.g., light) from the electronic component 20d to the sensing region 20e2 of the electronic component 20e.

The block layer 33 may be disposed over the surface 13s2 of the carrier 13. In some embodiments, the block layer 33 may include an opaque material. The block layer 33 may have a surface 33s1 (or a top surface), a surface 33s2 (or a top surface), and a surface 33s3 (or a top surface). The surface 33s2 may have an elevation or a level higher than that of the surface 33s1 of the block layer 33. The surface 33s3 may have an elevation or a level higher than that of the surface 33s2 of the block layer 33. The surfaces 33s2 and 33s3 of the block layer 33 may define an extended portion 33p. The extended portion 33p may protrude from the surface 33s2 of the block layer 33.

The transparent element 43 may be disposed over the surface 13s2 of the carrier 13. The transparent element 43 may encapsulate the electronic components 20d and 20e. The transparent element 43 may have a surface 43s1 (or a top surface) and a surface 43s2 (or a top surface). The surface 43s2 may have an elevation or a level higher than that of the surface 43s1 of the transparent element 43. In some embodiments, the surface 43s2 of the transparent element 43 may be substantially aligned with the surface 33s3 of the block layer 33. In some embodiments, the transparent element 43 may include a protruded portion 43p protruding from the surface 43s1 of the transparent element 43. In some embodiments, the protruded portion 43p of the transparent element 43 may be disposed within the aperture 33o1 (or aperture 33o2) of the block layer 33.

In some embodiments, the transparent element 43 may define a recess 43r between the electronic components 20d and 20e. In some embodiments, a portion of the block layer 33 may be conformally disposed within the recess 43r of the transparent element 43 and thus define a recess 33r over the dam structure 70. The transparent element 43 may have a surface 43s3 serving as the bottom of the recess 43r.

In some embodiments, the dam structure 70 may be disposed over the 13s2 of the carrier 13. In some embodiments, the dam structure 70 may be disposed over the electronic component 20e. As shown in FIG. 9D, the dam structure 70 may be disposed across the electronic component 20e. In some embodiments, the dam structure 70 may cover two opposite lateral surfaces of the electronic component 20e. The dam structure 70 may be in contact with the electronic component 20e. Referring back to FIG. 9C, the dam structure 70 may be configured to prevent a laterally optical communication between the electronic component 20d and the sensing region 20e2 of the electronic component 20e. The dam structure 70 may include an opaque material. In some embodiments, the material of the dam structure 70 may be the same as or similar to that of the block layer 33. In some embodiments, an interface may be formed between the block layer 33 and the dam structure 70. The dam structure 70 may have a surface 70s1 (or a top surface). In some embodiments, the surface 70s1 of the dam structure 70 may be aligned with the surface 43s3 of the transparent element 43. In some embodiments, a surface roughness of the surface 70s1 of the dam structure 70 is greater than a surface roughness of one of other surfaces (e.g., the bottom surface or the lateral surface) of the dam structure 70.

In this embodiment, the block layer 33 may be formed over the transparent element 43 by a coating technique, and the dimension of the extended portion 33p may be defined by the dimension of the protruded portion 43p, which may be easily controlled or modified by a mould. In this embodiment, a predetermined distance between the block layer 33 and the transparent element 43 is not required, which thereby facilitates the miniaturization of the optical device 1i.

Figure 10:
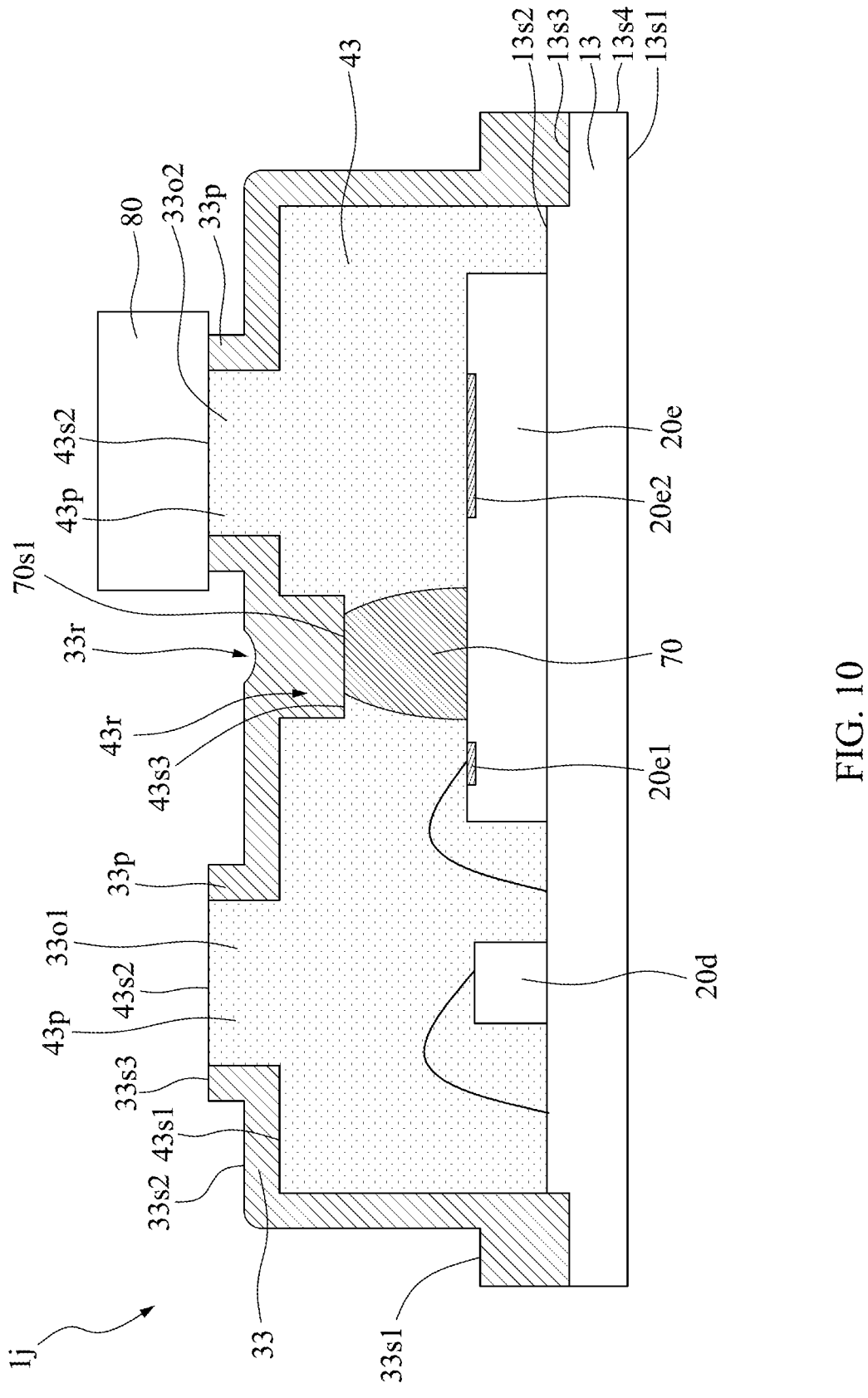
FIG. 10 is a cross-sectional view of an optical device in accordance with some embodiments of the present disclosure.

FIG. 10 is a cross-sectional view of an optical device 1j in accordance with some embodiments of the present disclosure. As shown in FIG. 10, the optical device 1j may have a structure similar to the optical device 1i of FIG. 9C, except that the optical device 1j may further include an optical element 80.

In some embodiments, the optical element 80 may cover the aperture 33o2 of the block layer 33. In some embodiments, the optical element 80 may cover the electronic component 20e. In some embodiments, the optical element 80 may be disposed over the surface 33s3 of the block layer 33. In some embodiments, the optical element 80 may be disposed over the extended portion 33p of the block layer 33. In some embodiments, the optical element 80 may be disposed over the surface 43s2 of the transparent element 43. In some embodiments, the optical element 80 may be disposed over the protruded portion 43p of the transparent element 43. In some embodiments, the optical element 80 may be configured to let a specific wavelength of an optical signal, reflected by a target object (not shown), pass through, which thereby reduces signal noise and thus improves the sensitivity of the optical device 1j. For example, the optical element 80 may be disposed over the electronic component 20e and configured to filter a specific wavelength of a light. In some embodiments, the optical element 80 may include, for example, a filter or other suitable optical elements.

FIG. 11A through FIG. 11F illustrate a method for manufacturing an optical device according to some embodiments of the present disclosure. In some embodiments, the method is for manufacturing an optical device, such as the optical device 1c shown in FIG. 3.

Figure 11A:
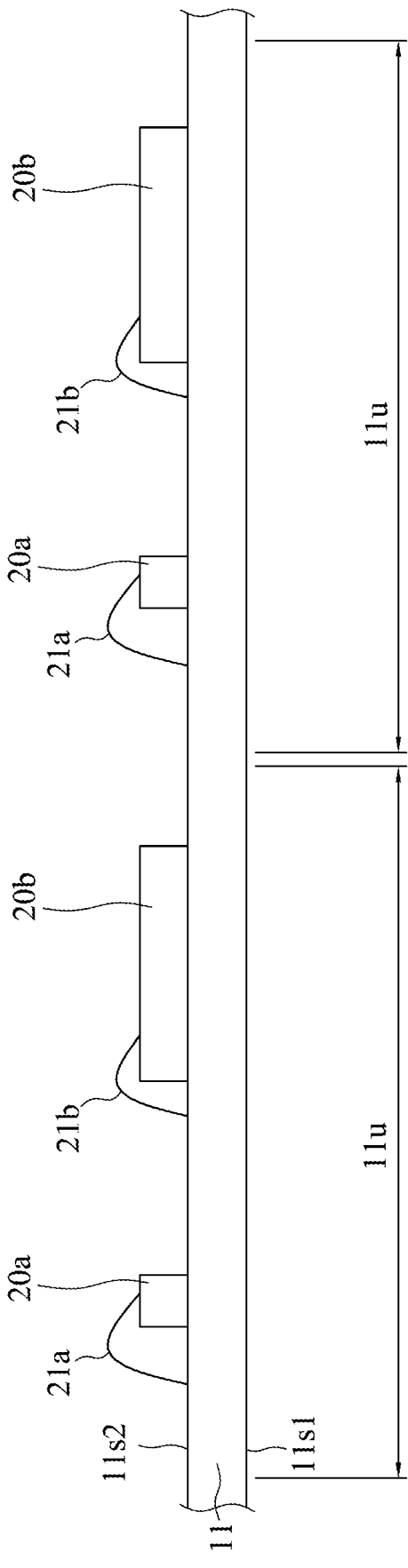
FIG. 11A illustrates one or more stages of an example of a method for manufacturing an optical device according to some embodiments of the present disclosure.

Referring to FIG. 11A, a carrier 11 may be provided. The carrier 11 may include a plurality of units 11u, each of which may be configured to define an optical device after the carrier 11 is singulated. The carrier 11 may have a surface 11s1 and a surface 11s2. Electronic components 20a and 20b may be formed over or disposed on the surface 11s2 of the carrier 11. A bonding wire 21a may be formed or disposed to electrically connect the electronic component 20a and the carrier 11. A bonding wire 21b may be formed or disposed to electrically connect the electronic component 20b and the carrier 11. A scribe line region (not annotated) may be located between the units 11u.

Figure 11B:
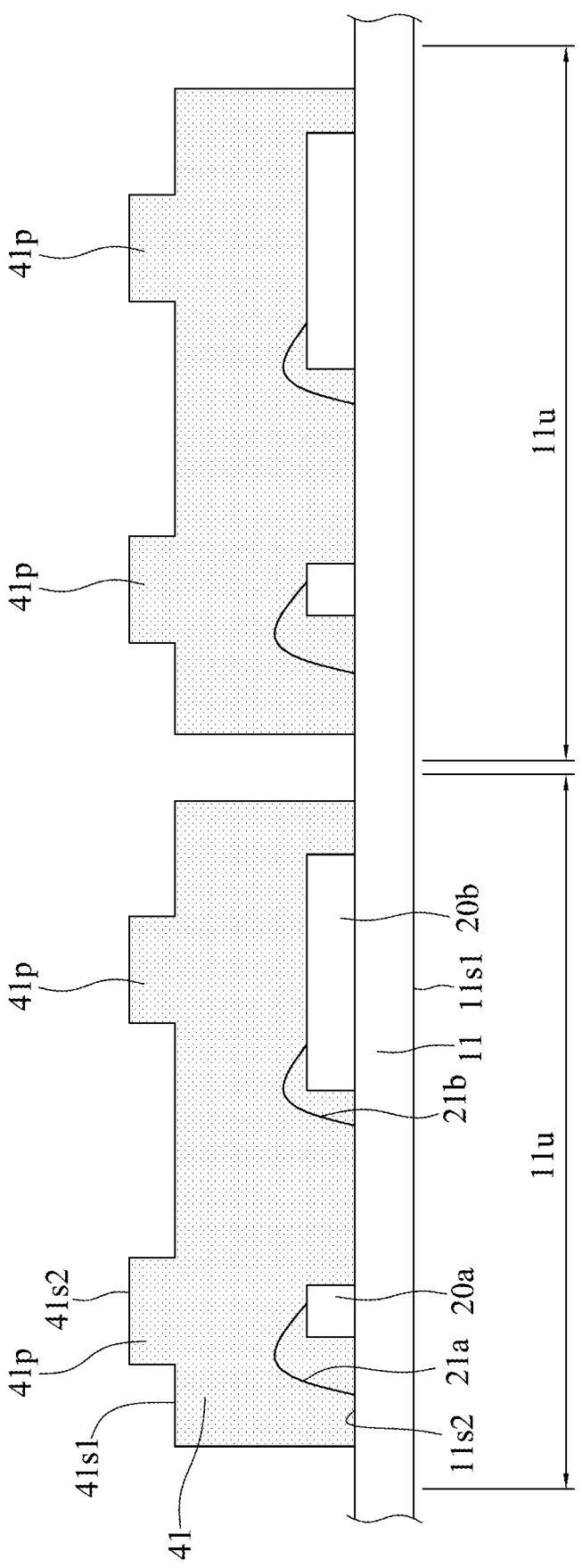
FIG. 11B illustrates one or more stages of an example of a method for manufacturing an optical device according to some embodiments of the present disclosure.

Referring to FIG. 11B, a transparent element 41 may be formed or disposed over the surface 11s2 of the carrier 11. The transparent element 41 may have a surface 41s1 and a surface 41s2 located at an elevation or level higher than that of the surface 41s1. The transparent element 41 may include a plurality of protruded portions 41p. In some embodiments, the protruded portion 41p may be formed directly over the electronic component 20a and/or 20b to encapsulate the electronic component 20a and/or 20b and the bonding wire 21a and/or 21b. The profile of the transparent element 41 may be modified by a mould (not shown).

Figure 11C:
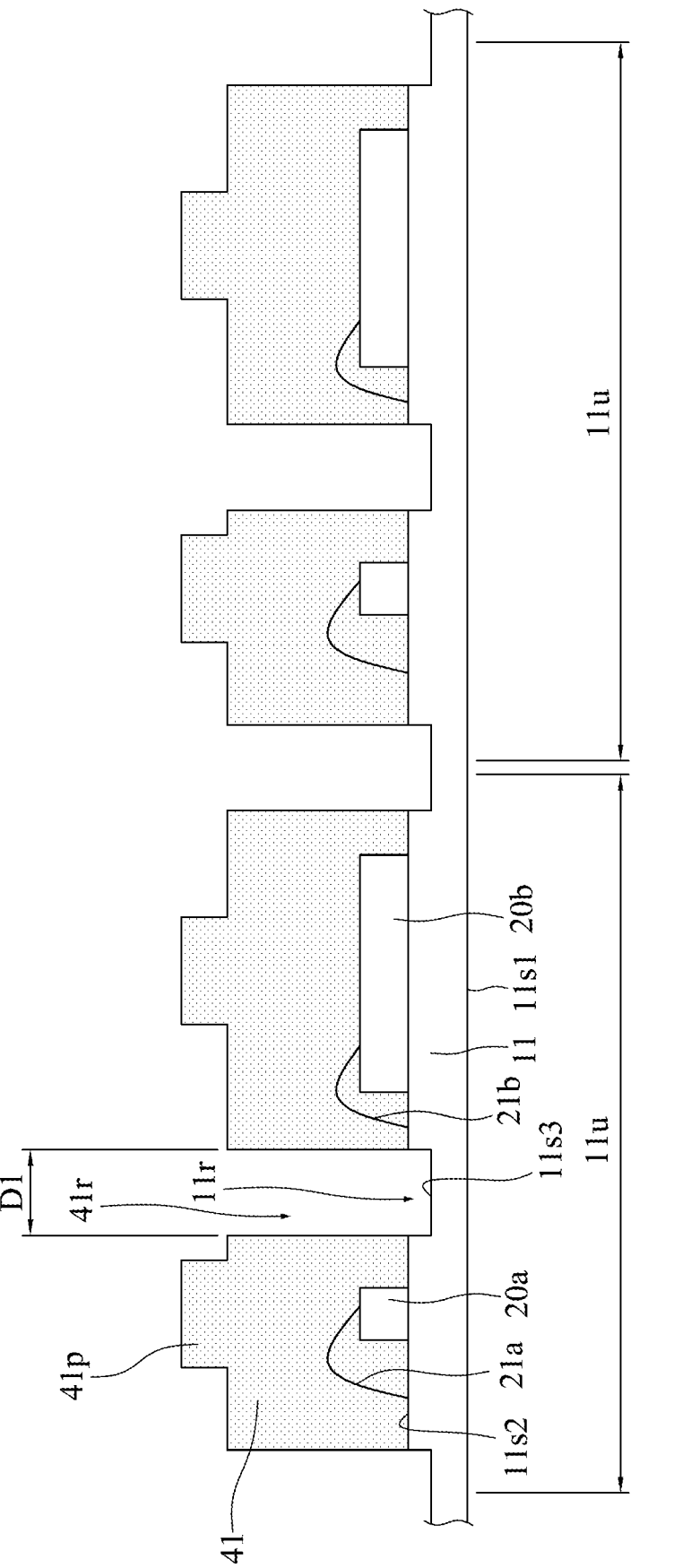
FIG. 11C illustrates one or more stages of an example of a method for manufacturing an optical device according to some embodiments of the present disclosure.

Referring to FIG. 11C, a half-cut technique may be performed. A portion of the transparent element 41 between the electronic components 20a and 20b may be removed to define a recess 41r. In some embodiments, a portion of the carrier 11 may be removed, and a surface 11s3 may be formed to define a recess 11r. In some embodiments, the dimension D1 (e.g., width, length, or diameter) of the recess 41r may be determined by a thickness of a block layer, which may be formed in subsequent stages. In some embodiments, the dimension D1 of the recess 41r may be determined by a process tolerance of a singulation technique, which may be performed in subsequent stages. For example, the dimension D1 of the recess 41r may range from about 200 μm to about 300 μm, such as 200 μm, 210 μm, 230 μm, 250 μm, 270 μm, 290 μm, or 300 μm.

Figure 11D:
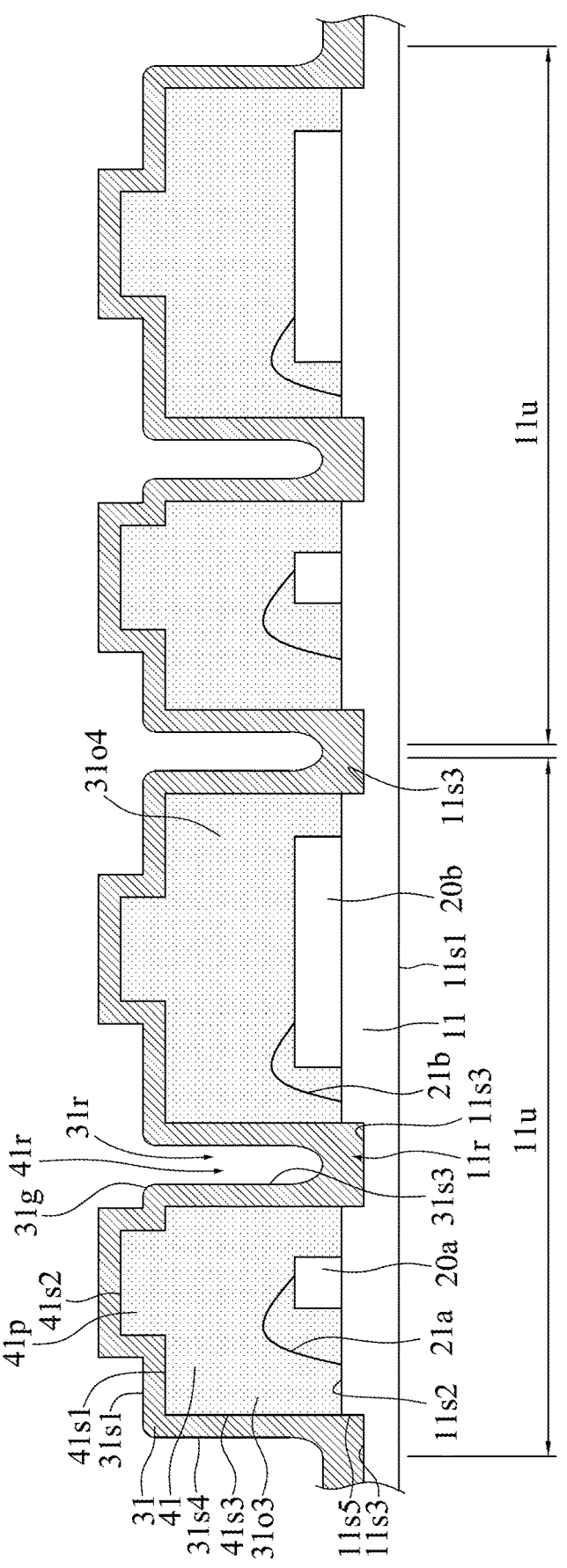
FIG. 11D illustrates one or more stages of an example of a method for manufacturing an optical device according to some embodiments of the present disclosure.

Referring to FIG. 11D, a block layer 31 may be formed over the transparent element 41. In some embodiments, the block layer 31 may be formed by a coating technique. The block layer 31 may be conformally formed over the transparent element 41. The block layer 31 may cover the protruded portion 41p of the transparent element 41. The block layer 31 may fill in the recess 41r and the recess 11r to define a recess 31r between the electronic components 20a and 20b.

Figure 11E:
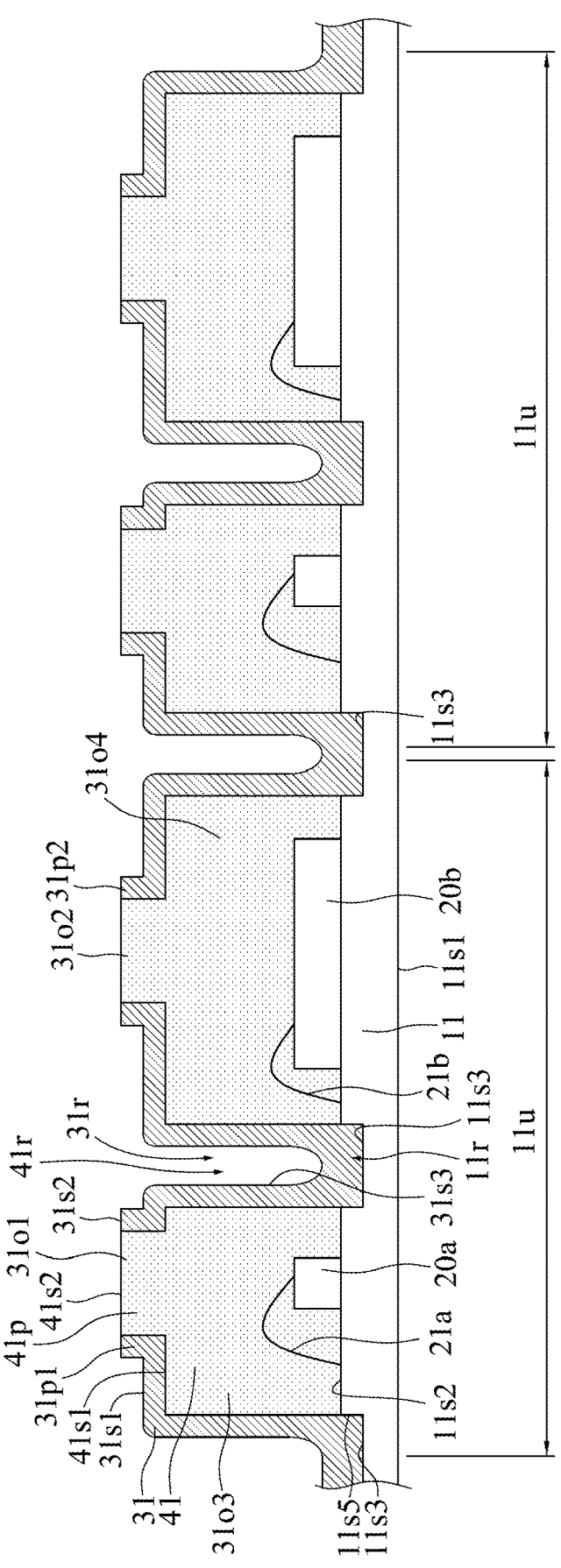
FIG. 11E illustrates one or more stages of an example of a method for manufacturing an optical device according to some embodiments of the present disclosure.

Referring to FIG. 11E, a portion of the block layer 31 may be removed. The block layer 31 may be removed by, for example, a grinding technique. The block layer 31 over the protruded portion 41p of the transparent element 41 may be removed to expose the protruded portion 41p. After the grinding technique is performed, a surface 31s2 of the block layer 31 may be substantially aligned with a surface 41s2 of the transparent element 41. The apertures 31o1, 31o2, 31o3, and 31o4 may be defined by the block layer 31.

Figure 11F:
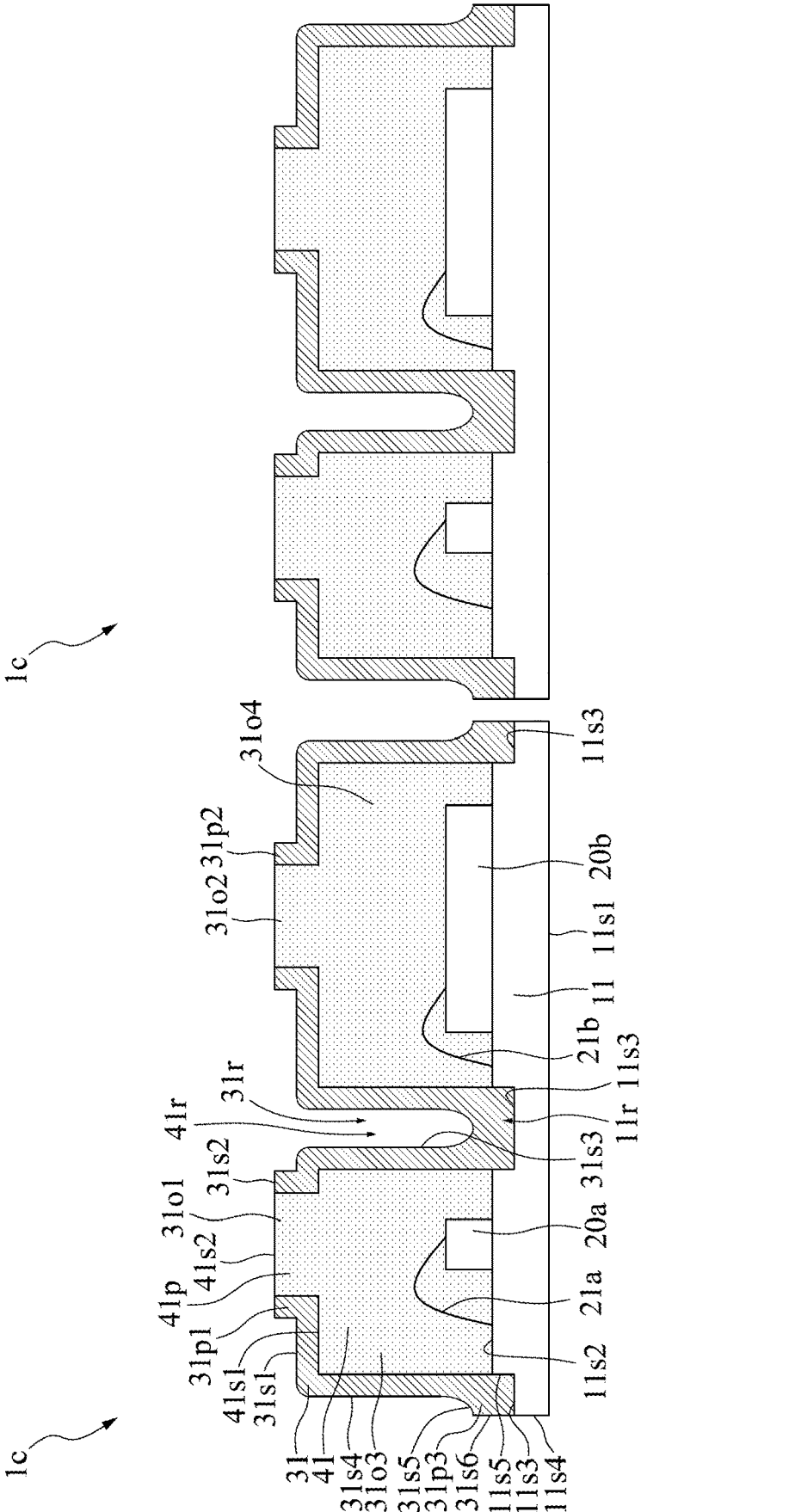
FIG. 11F illustrates one or more stages of an example of a method for manufacturing an optical device according to some embodiments of the present disclosure.

Referring to FIG. 11F, a singulation technique may be performed to separate the plurality of units 11u. As a result, a plurality of optical devices, such as the optical device 1c as shown in FIG. 3, may be produced.

In a comparative example, a plastic lid is utilized to separate a receiver from an emitter. The plastic lid is formed by an injection molding technique. In this condition, a vertical distance between an upper surface of the transparent element and the plastic lid is required for process tolerance, and a horizontal distance between the plastic lid and a lateral surface of the transparent element is also required for process tolerance. In this embodiment, the block layer 31 may be formed over the transparent element 41 by a coating technique, and a predetermined distance (e.g., vertical distance and/or horizontal distance) between the transparent element 41 and the block layer 31 is not required, which thereby facilitates the miniaturization of the optical device 1c.

Figure 12A:
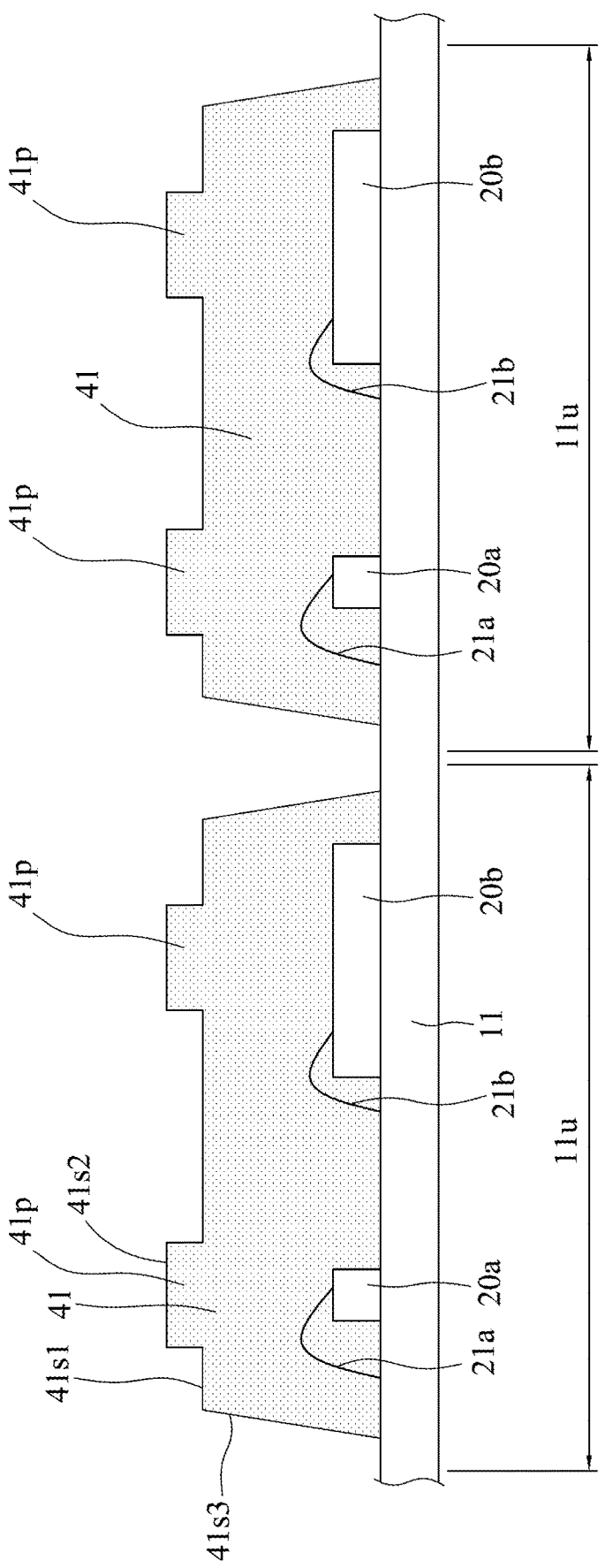
FIG. 12A illustrates one or more stages of an example of a method for manufacturing an optical device according to some embodiments of the present disclosure.
Figure 12B:
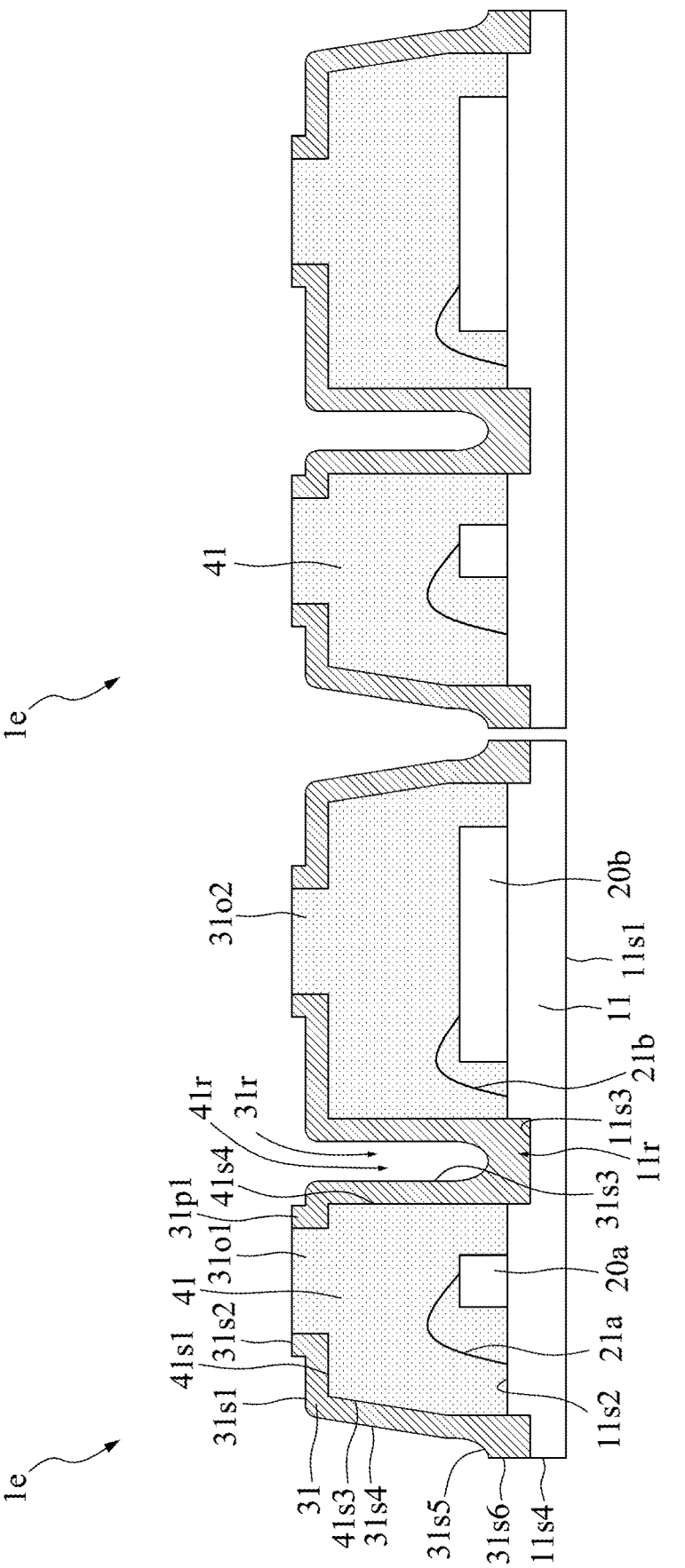
FIG. 12B illustrates one or more stages of an example of a method for manufacturing an optical device according to some embodiments of the present disclosure.

FIG. 12A and FIG. 12B illustrate a method for manufacturing an optical device according to some embodiments of the present disclosure. In some embodiments, the method is for manufacturing an optical device, such as the optical device 1e shown in FIG. 5. The initial stage of the illustrated process is the same as, or similar to, the stage illustrated in FIG. 11A through FIG. 11B. FIG. 12A depicts a stage subsequent to that depicted in FIG. 11A.

Referring to FIG. 12A, a transparent element 41 may be formed over the surface 11s2 of the carrier 11. The transparent element 41 may have a surface 41s3, which is slanted with respect to the surface 41s1. The profile of the transparent element 41 may be modified by a mould (not shown).

Referring to FIG. 12B, the block layer 31 may be formed over the transparent element 41, and a singulation technique may be performed to separate the plurality of units 11u. As a result, a plurality of optical devices, such as the optical device 1e as shown in FIG. 5, may be produced. The stages from FIG. 12A to FIG. 12B may be the same as or similar to those from FIG. 11B to FIG. 11F.

Figure 13A:
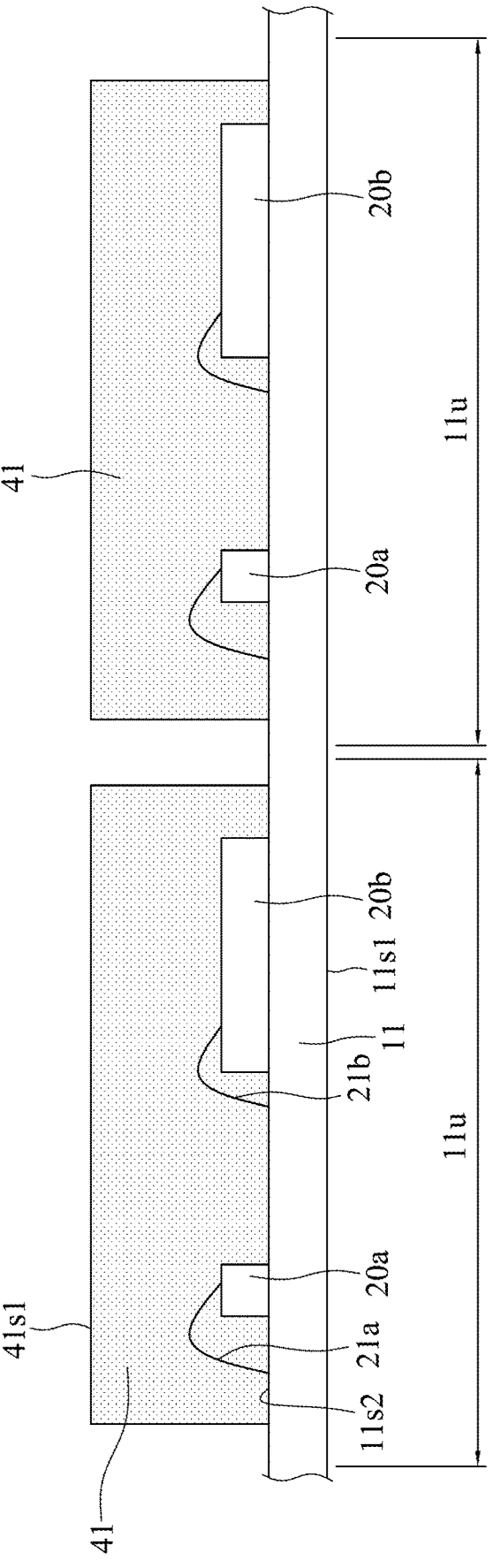
FIG. 13A illustrates one or more stages of an example of a method for manufacturing an optical device according to some embodiments of the present disclosure.

FIG. 13A through FIG. 13F illustrate a method for manufacturing an optical device according to some embodiments of the present disclosure. In some embodiments, the method is for manufacturing an optical device, such as the optical device 1d shown in FIG. 4. The initial stage of the illustrated process is the same as, or similar to, the stage illustrated in FIG. 11A through FIG. 11B. FIG. 13A depicts a stage subsequent to that depicted in FIG. 11A.

Referring to FIG. 13A, the transparent element 41 may have a surface 41$s$1 continuously extending between two opposite lateral surfaces (not annotated). In this embodiment, the transparent element 41 may not have protruded portions.

Figure 13B:
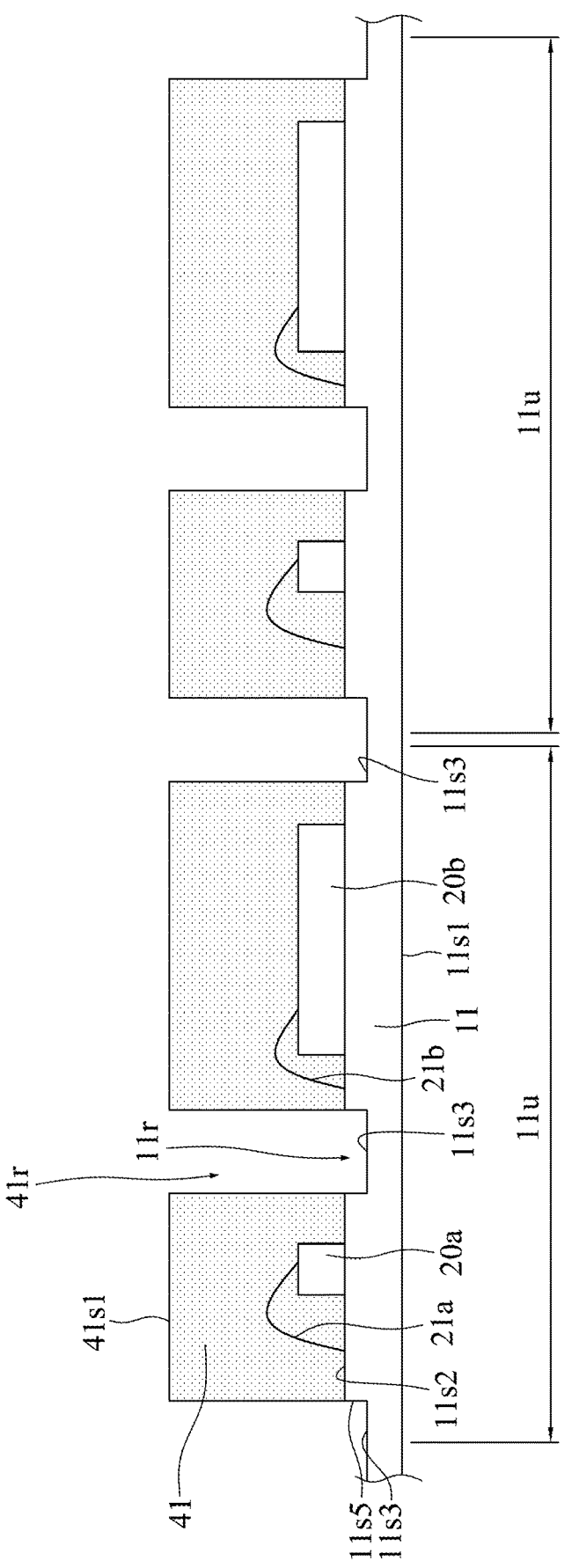
FIG. 13B illustrates one or more stages of an example of a method for manufacturing an optical device according to some embodiments of the present disclosure.

Referring to FIG. 13B, a half-cut technique may be performed. A portion of the transparent element 41 between the electronic components 20$a$ and 20$b$ may be removed to define a recess 41$r$. In some embodiments, a portion of the carrier 11 may be removed, and a surface 11$s$3 may be formed to define a recess 11$r$.

Figure 13C:
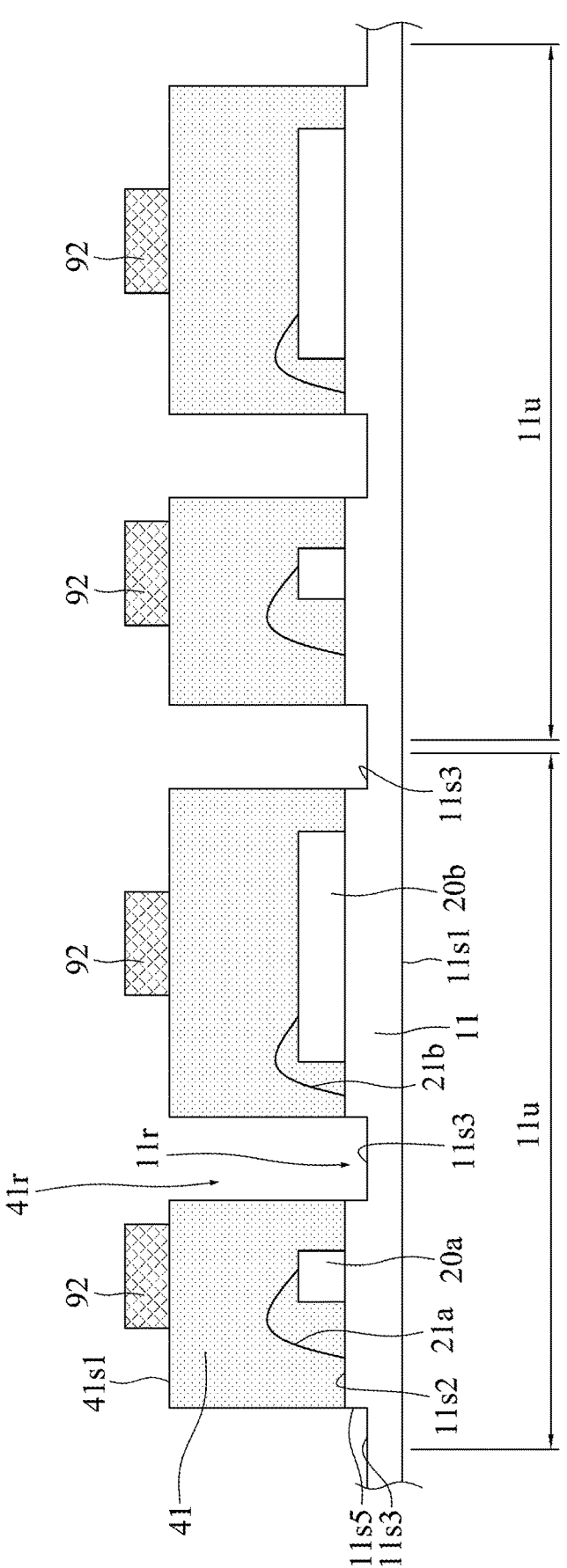
FIG. 13C illustrates one or more stages of an example of a method for manufacturing an optical device according to some embodiments of the present disclosure.

Referring to FIG. 13C, a dummy structure 92 may be formed or disposed over the surface 41$s$1 of the transparent element 41. The dummy structure 92 may be configured to define or modify an aperture of a block layer, which will be formed in subsequent stages. In some embodiments, the dummy structure 92 may include a photoresist, polymer, glass, or other suitable materials. When the dummy structure 92 includes a photoresist, the pattern of the dummy structure 92 may be defined by a photolithography technique, which facilitates the miniaturization of dummy structure 92, and further facilitates the miniaturization of the apertures 31$o$1 and 31$o$2 (shown in FIG. 13F) which are defined by the dummy structure 92.

Figure 13D:
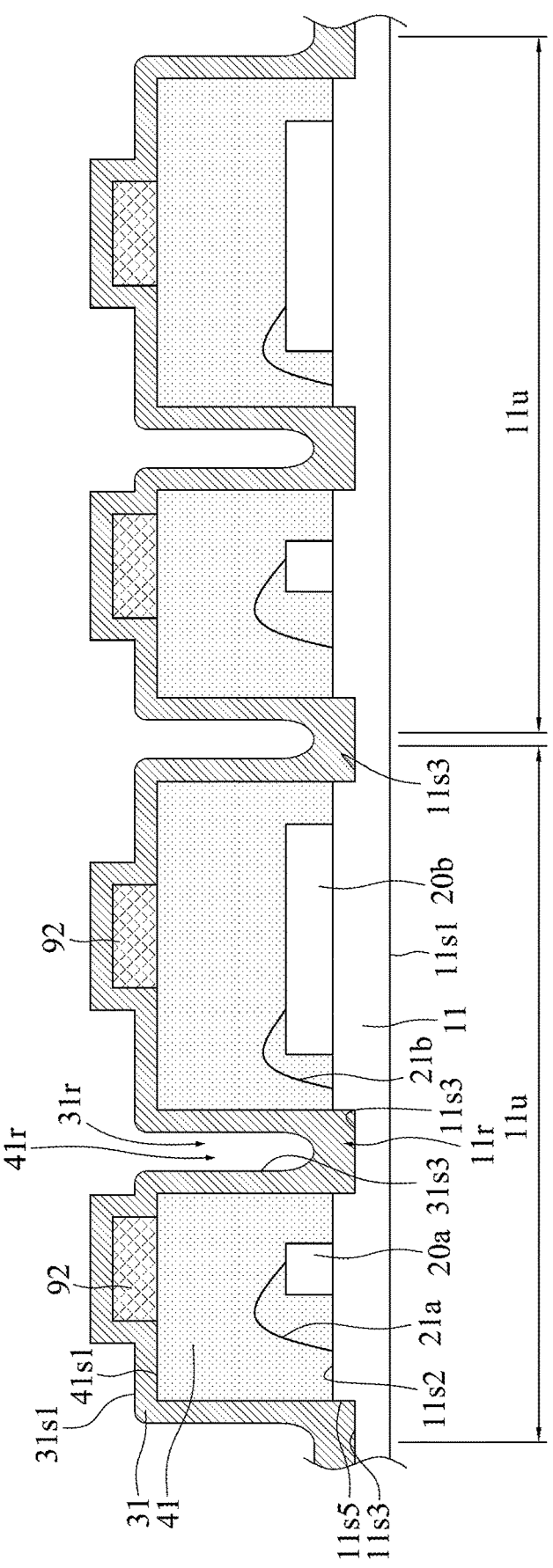
FIG. 13D illustrates one or more stages of an example of a method for manufacturing an optical device according to some embodiments of the present disclosure.

Referring to FIG. 13D, a block layer 31 may be formed over the transparent element 41 and the dummy structure 92. In some embodiments, the block layer 31 may be formed by a coating technique. The block layer 31 may be conformally formed over the transparent element 41 and the dummy structure 92. The block layer 31 may cover the dummy structure 92.

Figure 13E:
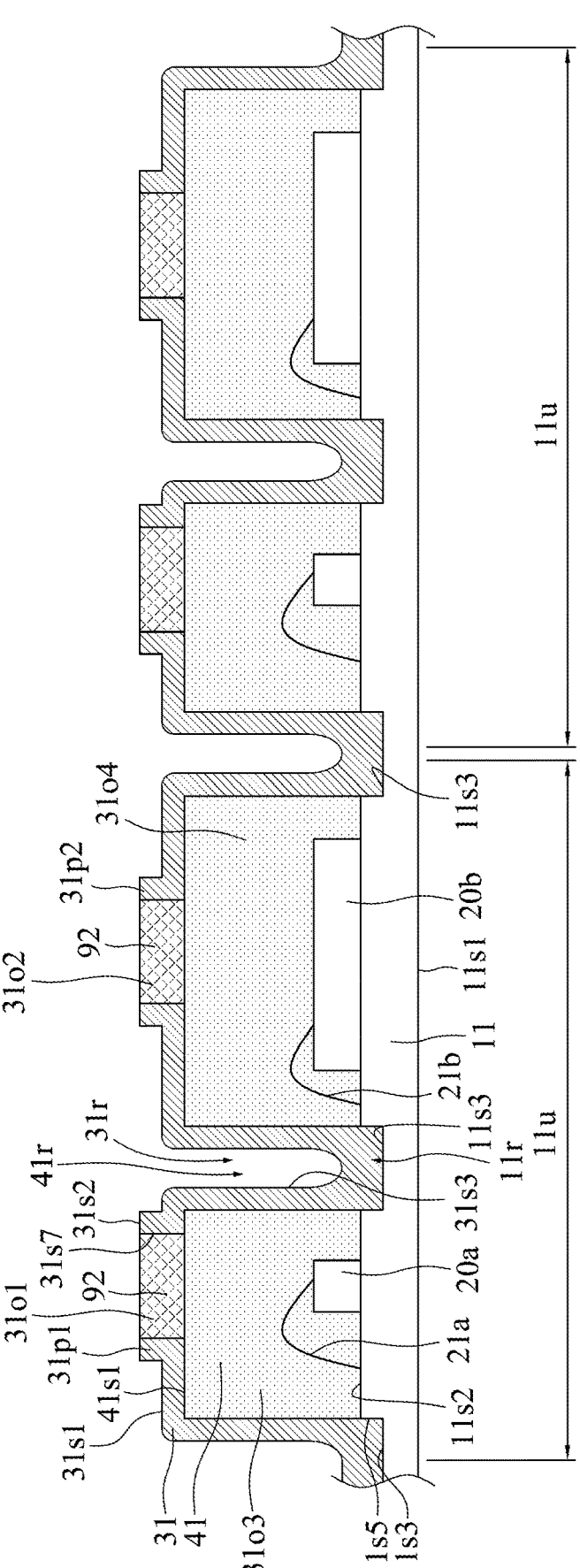
FIG. 13E illustrates one or more stages of an example of a method for manufacturing an optical device according to some embodiments of the present disclosure.

Referring to FIG. 13E, a portion of the block layer 31 may be removed. The block layer 31 may be removed by, for example, a grinding technique. The block layer 31 over the dummy structure 92 may be removed to expose the dummy structure 92. After the grinding technique is performed, a surface 31$s$2 of the block layer 31 may be substantially aligned with a top surface (not annotated) of the dummy structure 92.

Figure 13F:
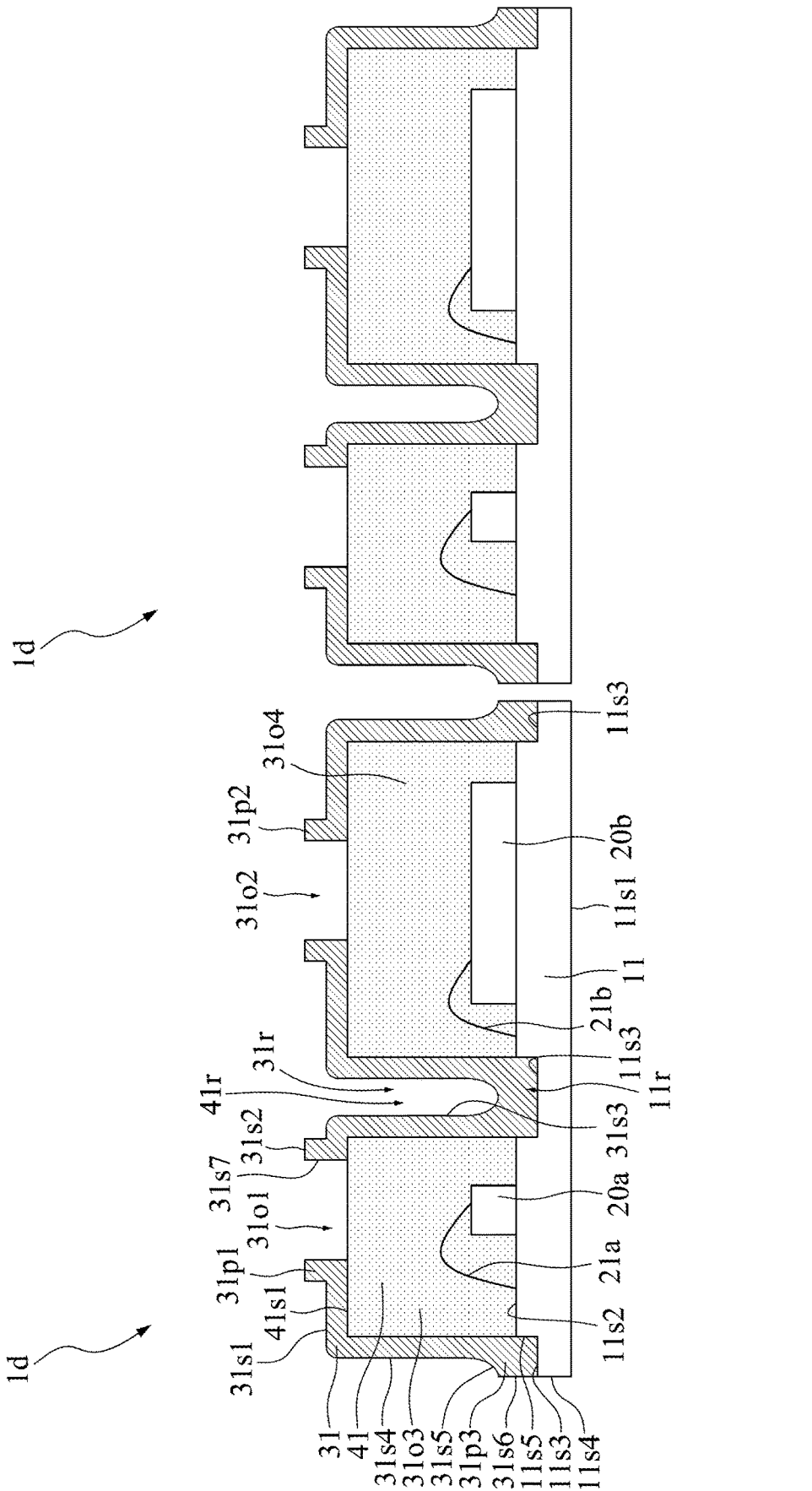
FIG. 13F illustrates one or more stages of an example of a method for manufacturing an optical device according to some embodiments of the present disclosure.

Referring to FIG. 13F, the dummy structure 92 may be removed, and the surface 41$s$1 of the transparent element 41 may be exposed from the block layer 31. Further, a singulation technique may be performed to separate the plurality of units 11$u$. As a result, a plurality of optical devices, such as the optical device 1$d$ as shown in FIG. 4, may be produced.

FIG. 14A through FIG. 14F illustrate a method for manufacturing an optical device according to some embodiments of the present disclosure. In some embodiments, the method is for manufacturing an optical device, such as the optical device 1$i$ shown in FIG. 9C.

Figure 14A:
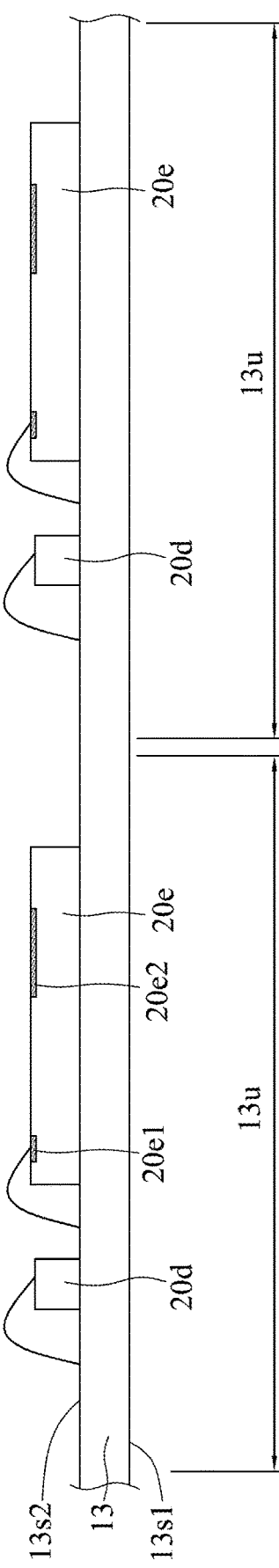
FIG. 14A illustrates one or more stages of an example of a method for manufacturing an optical device according to some embodiments of the present disclosure.

Referring to FIG. 14A, a carrier 13 may be provided. The carrier 13 may include a plurality of units 13$u$, each of which may be configured to define optical devices after the carrier 13 is singulated. The carrier 13 may have a surface 13$s$1 and a surface 13$s$2. Electronic components 20$d$ and 20$e$ may be formed over the surface 13$s$2 of the carrier 13.

Figure 14B:
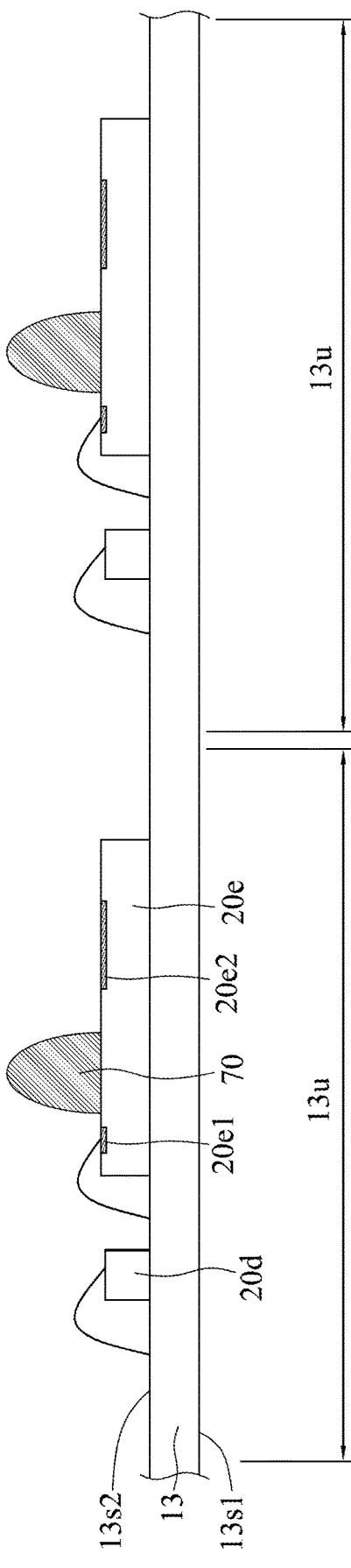
FIG. 14B illustrates one or more stages of an example of a method for manufacturing an optical device according to some embodiments of the present disclosure.

Referring to FIG. 14B, a dam structure 70 may be formed over the electronic component 20$e$. The dam structure 70 may be formed between the sensing region 20$e$2 and the sensing region 20$e$2 of the electronic component 20$e$. The dam structure 70 may be formed across the electronic component 20$e$.

Figure 14C:
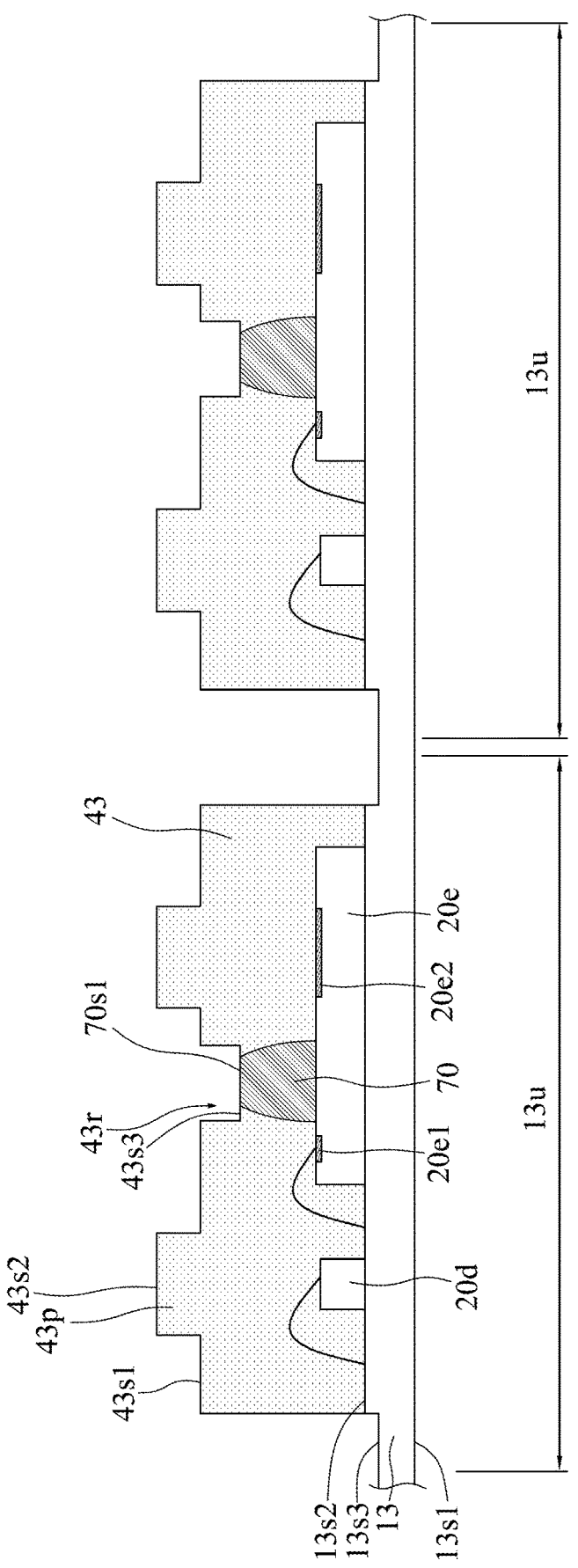
FIG. 14C illustrates one or more stages of an example of a method for manufacturing an optical device according to some embodiments of the present disclosure.

Referring to FIG. 14C, a transparent element 43 may be formed over the surface 13$s$2 of the carrier 13. The transparent element 43 may cover the electronic components 20$d$ and 20$e$. The transparent element 43 may cover the dam structure 70. In some embodiments, a half-cut technique may be performed to remove a portion of the transparent element 43 to define a recess 43$r$. A portion of the carrier 13 may be removed. The transparent element 43 over the dam structure 70 may be removed. In some embodiments, a portion of the dam structure 70 may be removed. As a result, a surface 43$s$3 of the transparent element 43 may be substantially aligned with a surface 70$s$1 of the dam structure 70.

Figure 14D:
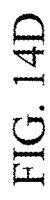
FIG. 14D illustrates one or more stages of an example of a method for manufacturing an optical device according to some embodiments of the present disclosure.

Referring to FIG. 14D, a block layer 33 may be formed over the transparent element 43. Further, a singulation technique may be performed to separate the plurality of units 13$u$. As a result, a plurality of optical devices, such as the optical device 1$i$ as shown in FIG. 9C, may be produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only and that practical implementations of the structures described herein can be spatially arranged in any orientation or manner, provided that the merits of embodiments of this disclosure are not deviated from by such an arrangement.

As used herein, the term "vertical" is used to refer to upward and downward directions, whereas the term "horizontal" refers to directions transverse to the vertical directions.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.10, or less than or equal to ±0.05°.

Two surfaces can be deemed to be coplanar or substantially coplanar if a displacement between the two surfaces is not exceeding 5 μm, not exceeding 2 μm, not exceeding 1 μm, or not exceeding 0.5 μm. A surface can be deemed to be substantially flat if a displacement between the highest point and the lowest point of the surface is not exceeding 5 μm, not exceeding 2 μm, not exceeding 1 μm, or not exceeding 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity exceeding approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit, and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device, comprising:
an emitter;
a receiver;
a transparent element disposed over the emitter and the receiver, wherein the transparent element defines a first recess between the emitter and the receiver; and
a block layer conformally disposed over the transparent element and the first recess,
wherein the block layer includes a first upper surface and a lateral surface connected to the first upper surface, and wherein the lateral surface defines an aperture exposing the emitter, and the lateral surface contacts the transparent element, a surface roughness of the first upper surface of the block layer is greater than a surface roughness of a second upper surface of the block layer, and the second upper surface is at an elevation different from an elevation of the first upper surface, and a surface roughness of a top surface of the transparent element is greater than a surface roughness of one of other surfaces of the transparent element.

2. The optical device of claim 1, further comprising:
a carrier supporting the emitter and the receiver,
wherein a lateral surface of the transparent element is substantially aligned with a lateral surface of the carrier.

3. The optical device of claim 1, wherein the transparent element fills the aperture.

4. The optical device of claim 1, further comprising:
a carrier supporting the emitter, the receiver and the transparent element, wherein the carrier defines a second recess between the emitter and the receiver.

5. The optical device of claim 4, wherein the block layer defines a third recess over the second recess.

6. An optical device, comprising:
a carrier;
an electronic component disposed over the carrier;
a transparent element covering the electronic component; and
a block layer defining a space accommodating the electronic component,
wherein the block layer includes a first upper surface, a second upper surface lower than the first upper surface and spaced apart from the transparent element, and a first lateral surface extending between the first upper surface and the second upper surface, and wherein the first lateral surface and the first upper surface collectively define a first portion protruding from the second upper surface of the block layer, and the first portion of the block layer defines an aperture exposing the electronic component, the transparent element is disposed within the space, the transparent element includes a protruding portion, the first upper surface of the first portion is substantially level with a top surface of the protruding portion of the transparent element, a profile of the aperture of the block layer is defined by the protruding portion of the transparent element, and wherein the first upper surface of the first portion and the top surface of the protruding portion are formed by grinding concurrently.

7. The optical device of claim 6, wherein the carrier defines a recess recessed from a top surface of the carrier, and the block layer is partially disposed within the recess of the carrier.

8. The optical device of claim 7, wherein the block layer includes a surface substantially aligned with a lateral surface of the carrier.

9. The optical device of claim 6, wherein the first portion of the block layer includes a second lateral surface opposite to the first lateral surface, and the transparent element contacts the second lateral surface and spaced apart from the first lateral surface.

10. The optical device of claim 9, wherein a vertical length of the first lateral surface is less than a vertical length of the second lateral surface.

11. An optical device, comprising:
a carrier;
a first electronic component disposed over the carrier;
a second electronic component disposed over the carrier;
a transparent element covering the first electronic component;
a block layer separating the first electronic component from the second electronic component, wherein the block layer defines a recess between the first electronic component and the second electronic component,

and wherein the block layer includes a first upper surface, a second upper surface at an elevation, with respect to the carrier, lower than that of the first upper surface, and a first lateral surface extending between the first upper surface and the second upper surface, and wherein the first upper surface is substantially aligned with an upper surface of the transparent element; and an optical element disposed over an aperture defined by the first upper surface and a second lateral surface, opposite to the first lateral surface, of the block layer, wherein the optical element is configured to filter a specific wavelength of a light, and a width of the optical element is greater than a width of the aperture.

12. The optical device of claim 11, further comprising:

a dam structure disposed between the carrier and the block layer, wherein the recess of the block layer is located over the dam structure.

13. The optical device of claim 11, wherein the block layer includes a first portion and a second portion, the second portion extends along a direction parallel to a top surface of the carrier, the first portion is perpendicular to the second portion, wherein the first portion has the first upper surface and the first lateral surface, the second portion has the second upper surface, and a horizontal thickness of the first portion is substantially equal to a vertical thickness of the second portion.

14. The optical device of claim 13, wherein the first portion of the block layer defines an aperture exposing the first electronic component, and a portion of the transparent element fills the aperture.

15. The optical device of claim 14, wherein the first portion and the second portion of the block layer are formed integrally.

16. The optical device of claim 11, further comprising:

an adhesive element disposed within the aperture of the block layer and configured to attach the optical element to the transparent element.

* * * * *